United States Patent
Lee et al.

(10) Patent No.: US 10,510,908 B2
(45) Date of Patent: Dec. 17, 2019

(54) SOLAR CELL PANEL

(71) Applicant: LG ELECTRONICS INC., Seoul (KR)

(72) Inventors: Jinhyung Lee, Seoul (KR); Jungmin Ha, Seoul (KR); Sangwook Park, Seoul (KR)

(73) Assignee: LG ELECTRONICS INC., Seoul (KR)

(*) Notice: Subject to any disclaimer, the term of this patent is extended or adjusted under 35 U.S.C. 154(b) by 160 days.

(21) Appl. No.: 15/465,026

(22) Filed: Mar. 21, 2017

(65) Prior Publication Data
US 2017/0278986 A1    Sep. 28, 2017

(30) Foreign Application Priority Data

Mar. 28, 2016  (KR) .................. 10-2016-0036715
Dec. 5, 2016   (KR) .................. 10-2016-0164404

(51) Int. Cl.
*H01L 31/02*      (2006.01)
*H01L 31/0224*    (2006.01)
(Continued)

(52) U.S. Cl.
CPC .... *H01L 31/02013* (2013.01); *H01L 31/0201* (2013.01); *H01L 31/022425* (2013.01);
(Continued)

(58) Field of Classification Search
None
See application file for complete search history.

(56) References Cited

U.S. PATENT DOCUMENTS 8,419,981 B2 * 4/2013 Choi .................. H01B 1/22
                                              252/512
8,653,380 B2 * 2/2014 Nishi ................ H01L 31/0508
                                              174/260

(Continued)

FOREIGN PATENT DOCUMENTS

JP      2002-76398 A       3/2002
KR   10-2009-0013721 A     2/2009
(Continued)

OTHER PUBLICATIONS

Zhao et al., Solar Energy Materials and Solar cells, 92 (2008), pp. 673-681 (Year: 2008).*

*Primary Examiner* — Eli S Mekhlin
(74) *Attorney, Agent, or Firm* — Birch, Stewart, Kolasch & Birch, LLP

(57) ABSTRACT

A solar cell panel includes a first solar cell and a second solar cell; and a plurality of leads connecting the first solar cell and the second solar cell. Each of the first solar cell and the second solar cell includes: a first electrode including a plurality of finger lines in a first direction and a plurality of first bus bars in a second direction crossing the first direction; and a second electrode including a plurality of second bus bars in the second direction. The plurality of leads have a diameter or width of 100 to 500 μm, and include 6 or more leads arranged at one surface side of the first or second solar cell. The plurality of leads are connected to the plurality of first bus bars of the first solar cell and the plurality of second bus bars of the second solar cell by a solder layer, respectively.

20 Claims, 11 Drawing Sheets

(51) Int. Cl.
*H01L 31/048* (2014.01)
*H01L 31/05* (2014.01)
*H01L 31/0747* (2012.01)
*H01L 31/075* (2012.01)

(52) U.S. Cl.
CPC ........... *H01L 31/022433* (2013.01); *H01L 31/022466* (2013.01); *H01L 31/0481* (2013.01); *H01L 31/0504* (2013.01); *H01L 31/0512* (2013.01); *H01L 31/075* (2013.01); *H01L 31/0747* (2013.01); *Y02E 10/50* (2013.01)

(56) References Cited

U.S. PATENT DOCUMENTS

| | | | |
|---|---|---|---|
| 8,975,175 B1* | 3/2015 | Pass | H01L 24/03 257/772 |
| 2004/0200522 A1* | 10/2004 | Fukawa | H01L 31/022425 136/259 |
| 2005/0199279 A1* | 9/2005 | Yoshimine | H01L 31/022425 136/251 |
| 2006/0113537 A1* | 6/2006 | Krulevitch | B81C 1/0023 257/57 |
| 2008/0092944 A1* | 4/2008 | Rubin | H01L 31/022425 136/252 |
| 2008/0121266 A1* | 5/2008 | Tsunomura | H01L 31/0747 136/244 |
| 2009/0032081 A1* | 2/2009 | Saita | H01L 31/022425 136/244 |
| 2011/0030757 A1* | 2/2011 | Lin | H01L 31/022433 136/24 |
| 2013/0298988 A1* | 11/2013 | Fukuda | H01L 31/0516 136/256 |

FOREIGN PATENT DOCUMENTS

| | | |
|---|---|---|
| KR | 10-2016-0001226 | 1/2016 |
| KR | 10-2016-0016304 A | 2/2016 |

* cited by examiner

SOLAR CELL PANEL

CROSS-REFERENCE TO RELATED APPLICATIONS

This application claims the priority benefit of Korean Patent Applications No. 10-2016-0036715 filed on Mar. 28, 2016 and No. 10-2016-0164404 filed on Dec. 5, 2015 in the Korean Intellectual Property Office, the disclosures of all of which are incorporated herein by reference.

BACKGROUND OF THE INVENTION

Field of the Invention

Embodiments of the present invention relate to a solar cell panel, and more particularly, to a solar cell panel including solar cells electrically connected to each other.

Description of the Related Art

Recently, as existing energy resources such as petroleum and coal are depleted, interest in alternative energy sources is increasing. In particular, a solar cell is highlighted as a next-generation cell capable of converting solar energy into electric energy.

A plurality of solar cells are connected in series or in parallel by a plurality of ribbons, and are then packaged through a packaging process for protection thereof, thereby forming a solar cell panel.

Generally, solar cells are connected using ribbons having a great width of about 1.5 mm. Then, shading loss may be generated due to such a great width of the ribbons. For this reason, the number of ribbons used for the solar cells should be reduced. For example, the number of ribbons may be three. As such, the number of ribbons is not sufficient, carrier generated by photoelectric conversion should travel with a long path in order to reach the ribbons. As a result, there is a limitation in enhancing output power of a solar cell panel.

Meanwhile, the ribbons may be attached by various methods. As an example, the ribbons may be attached to the solar cell by performing a thermo-compression bonding in the state that conductive adhesive films are disposed between electrodes of the solar cell and the ribbons. However, the conductive adhesive films are expensive. Also, the conductive adhesive films are positioned between the electrodes of the solar cell and the ribbons, respectively, and thus, the process of attaching the ribbons to the electrodes of the solar cell is complicated. More particularly, if a large number of interconnectors having widths smaller than widths of the ribbons are used, instead of the ribbons, in consideration of light loss, process cost and time may largely increase when the conductive adhesive films are used.

SUMMARY OF THE INVENTION

Therefore, embodiments of the present invention have been made in view of the above problems, and the present invention is to provide a solar cell panel having enhanced output power and being made by a simple process.

According to an embodiment of the invention, a solar cell panel includes a plurality of solar cells including a first solar cell and a second solar cell; and a plurality of leads for connecting the first solar cell and the second solar cell. Each of the first solar cell and the second solar cell includes: a semiconductor substrate; a first passivation layer on a front surface of the semiconductor substrate; a second passivation layer on a back surface of the semiconductor substrate; a first conductivity type region on the first passivation layer at the front surface of the semiconductor substrate; a second conductivity type region on the second passivation layer at the back surface of the semiconductor substrate; a first electrode electrically connected to the first conductivity type region, wherein the first electrode including a first metal electrode layer including a plurality of finger lines in a first direction and a plurality of first bus bars in a second direction crossing the first direction; and a second electrode electrically connected to the second conductivity type region, wherein the second electrode including a second metal electrode layer including a plurality of second bus bars in the second direction. The plurality of leads have a diameter or width of 100 to 500 μm, and include 6 or more leads arranged at one surface side of the first or second solar cell. The plurality of leads are connected to the plurality of first bus bars of the first solar cell and the plurality of second bus bars of the second solar cell by a solder layer, respectively.

According to this embodiment, an output of a solar cell panel can be improved through reducing a movement path of carriers by a large number of leads having a small width. Also, the leads have a circular cross-section, and thus, light loss can be minimized by diffuse reflection, and the output of the solar cell panel can be further improved. By applying the leads to a solar cell including a conductivity type region having a crystal structure different from that of a semiconductor substrate, the leads can be stably electrically connected to the solar cell, even if an alignment error of the leads having the small width occurs.

In this instance, the lead can be attached by a simple process to have a simple structure through using a solder layer. In this instance, at least one of first and second metal electrode layers includes metal particles and a cross-linking resin to prevent the solder layer from penetrating into the at least one of the first and second metal electrode layers, thereby improving reliability of the solar cell panel.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE EMBODIMENTS

Figure 1:
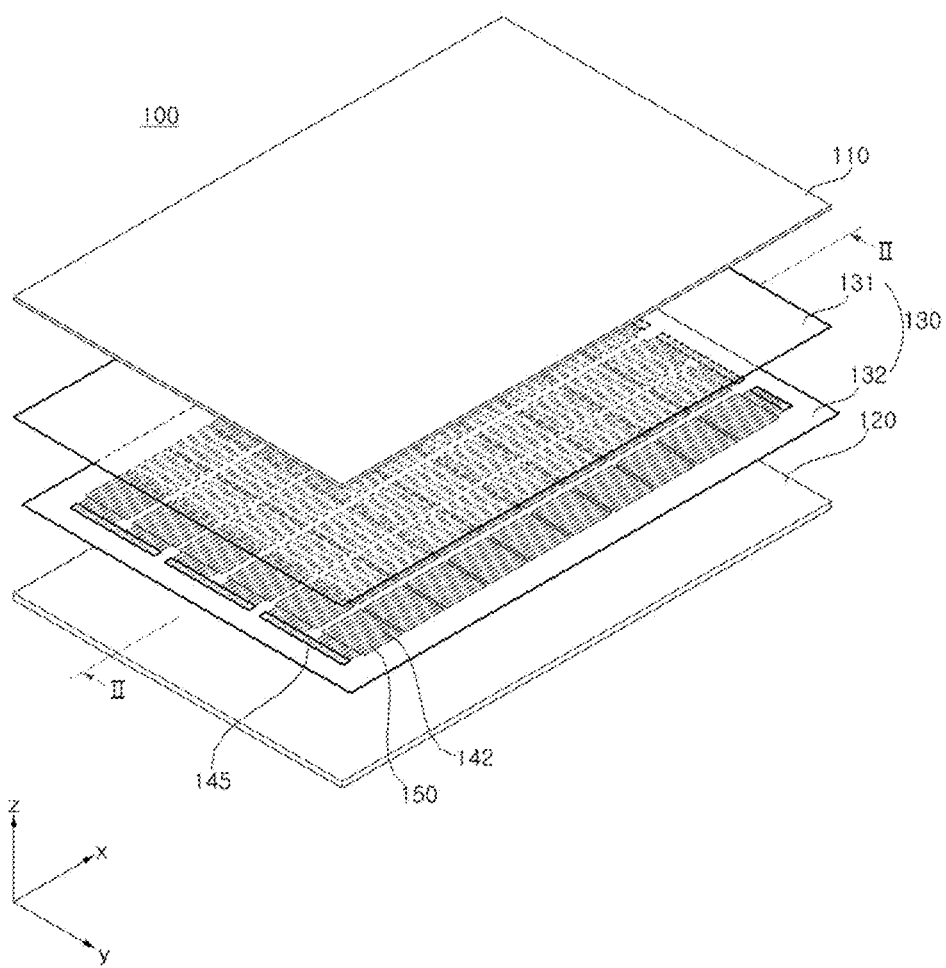
FIG. 1 is a perspective view of a solar cell panel according to an embodiment of the present invention.

Reference will now be made in detail to various embodiments of the invention, examples of which are illustrated in accompanying drawings. The invention may, however, be embodied in many alternate forms and should not be construed as limited to the embodiments set forth herein.

In the drawings, illustration of parts unrelated to embodiments of the present invention is omitted for clarity and simplicity of description. The same reference numerals designate the same or very similar elements throughout the specification. In the drawings, the thicknesses, widths or the like of elements are exaggerated or reduced for clarity of description, and should not be construed as limited to those illustrated in the drawings.

It will be understood that the terms "comprises" and/or "comprising," or "includes" and/or "including" used in the specification specify the presence of stated elements, but do not preclude the presence or addition of one or more other elements. In addition, it will be understood that, when an element such as a layer, film, region, or plate is referred to as being "on" another element, it may be directly disposed on another element or may be disposed such that an intervening element is also present therebetween. Accordingly, when an element such as a layer, film, region, or plate is disposed "directly on" another element, this means that there is no intervening element between the elements.

Hereinafter, a solar cell panel according to embodiments of the present invention will be described in detail with reference to the accompanying drawings.

Figure 2:
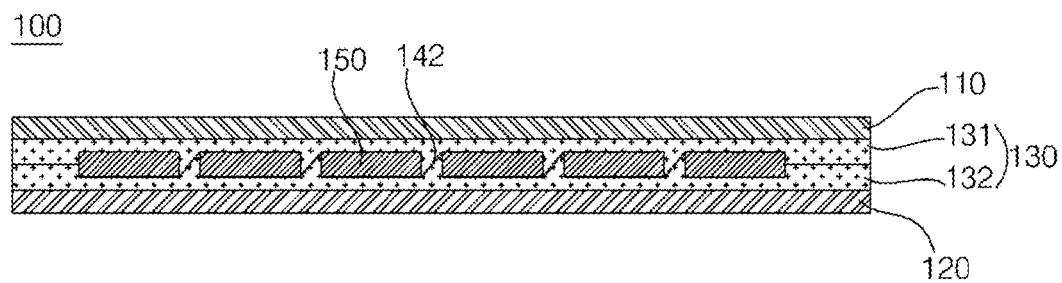
FIG. 2 is a cross-sectional view taken along line II-II in FIG. 1.

FIG. 1 is a perspective view of a solar cell panel according to an embodiment of the present invention, and FIG. 2 is a cross-sectional view taken along line II-II in FIG. 1.

Referring to FIGS. 1 and 2, a solar cell panel 100 according to the embodiment includes a plurality of solar cells 150, and leads 142 for electrically connecting the solar cells 150. The solar cell panel 100 also includes a sealant 130 for enclosing and sealing the solar cells 150 and leads 142, a front substrate 110 disposed at a front surface of the solar cells 150 on the sealant 130, and a back substrate 120 disposed at a back surface of the solar cells 150 on the sealant 130. This will be described in more detail.

In the embodiment, the solar cells 150 may be electrically connected in series, in parallel, or in series-parallel by the leads 142. The leads 142 and the solar cells 150 will be described in more detail later.

Bus ribbons 145 connect opposite ends of the leads 142 in solar cell strings, each of which is a column of the plurality of solar cells 150 connected through the leads 142, in an alternating manner. The bus ribbons 145 may be arranged at opposite ends of the solar cell strings, to extend in a direction crossing the solar cell strings. The bus ribbons 145 may connect adjacent ones of the solar cell strings, or connect the solar cell strings to a junction box for preventing backward flow of current. The material, shape, and connecting structure of the bus ribbons 145 may be varied and thus the invention is not limited thereto.

The sealant 130 may include a first sealant 131 disposed at the front surface of the solar cells 150 connected to each other by the leads 142, and a second sealant 132 disposed at the back surface of the solar cells 150. The first sealant 131 and the second sealant 132 block permeation of moisture or oxygen, and chemically combine elements constituting the solar cell panel 100. For the first sealant 131 and the second sealant 132, an insulating material having transparent property and adhesive property may be used. As an example, ethylene vinyl acetate (EVA) copolymer resin, polyvinyl butyral, silicone resin, ester-based resin, olefin-based resin, or the like may be used for the first sealant 131 and the second sealant 132. The back substrate 120, the second sealant 132, the solar cells 150, the first sealant 131 and the front substrate 110 or so on may have an integrated structure to form the solar cell panel 100 through a lamination process using the first sealant 131 and the second sealant 132.

The front substrate 110 is disposed on the first sealant 131 and constitutes a front surface of the solar cell panel 100. The back substrate 120 is disposed on the second sealant 131 and constitutes a back surface of the solar cell panel 100. The front substrate 110 and the back substrate 120 may be made of an insulating material capable of protecting the solar cells 150 from external impact, moisture, ultraviolet, or so on, Also, the front substrate 110 may be made of an optically-transparent material that light can be transmitted through. The back substrate 120 may be a sheet made of an optically-transparent material, a non-optically-transparent material, a reflective material, or the like, For example, the front substrate 110 may be a glass substrate and the back substrate 120 may be a TEDLAR®/PET/TEDLAR® (TPT) type or may have a structure in which a layer of polyvinylidene fluoride PVDF) resin or the like is formed on at least one surface of a base film (for example, polyethylene terephthalate (PET)).

However, the embodiments of the invention are not limited thereto. Thus, the first sealant 131 and the second sealant 132, the front substrate 110, or the back substrate 120 may be made of any of various materials other than the above materials and may have any of various structures other than the above structures. For example, the front substrate 110 or the back substrate 120 may have various structures (for example, a substrate, a film, a sheet, or so on) or various materials.

Hereinafter, the solar cell 150 and the lead 142 included in the solar cell panel 100 according to the embodiment of the invention will be described in more detail with reference to FIGS. 3 to 7.

Figure 3:
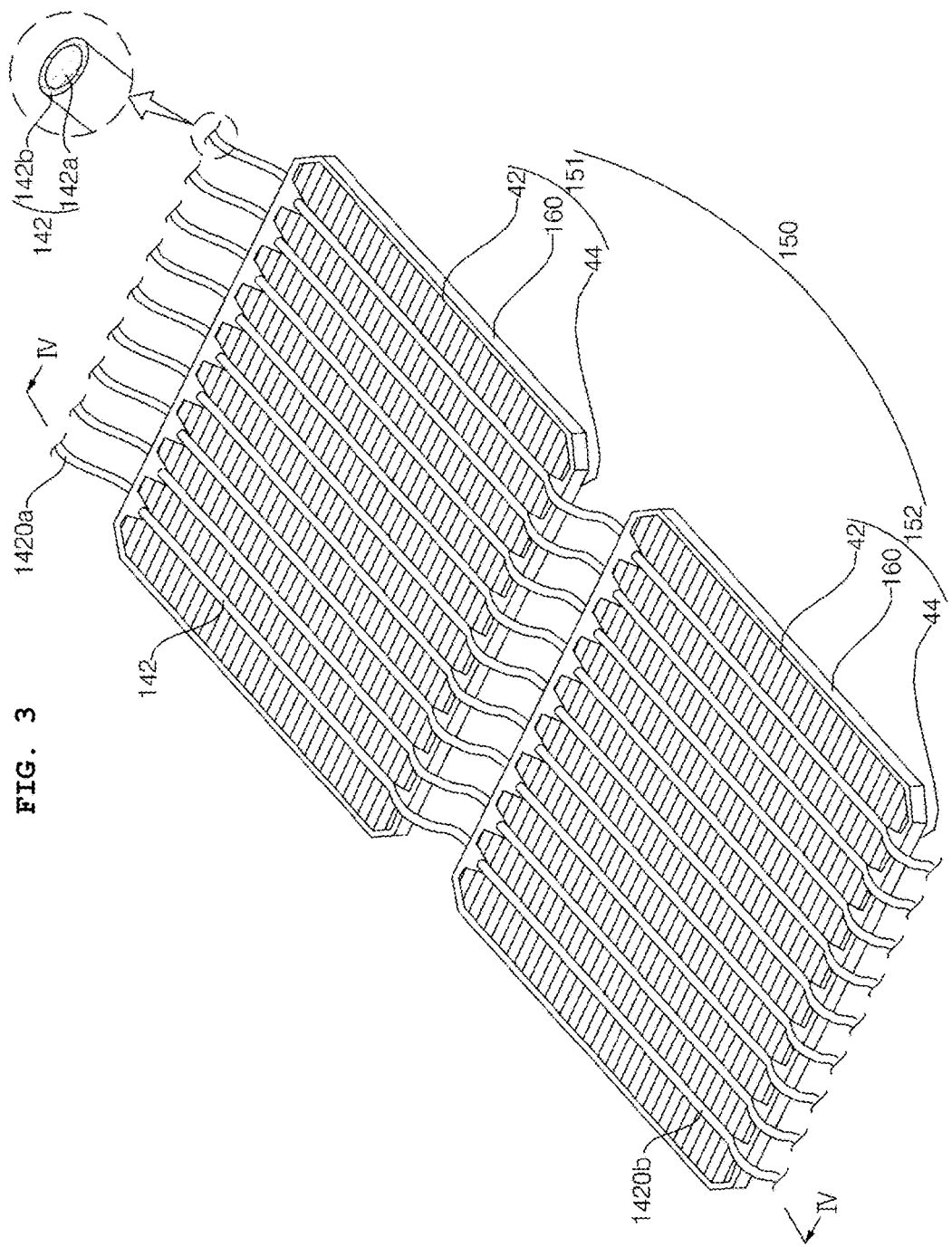
FIG. 3 is a perspective view of a first solar cell and a second solar cell connected by leads, which are included in the solar cell panel shown in FIG. 1.
Figure 4:
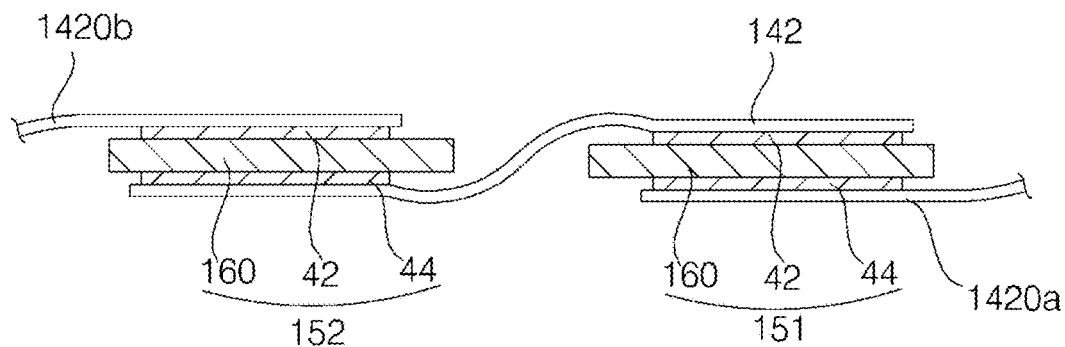
FIG. 4 is a cross-sectional view taken along line IV-IV in FIG. 3.
Figure 5:
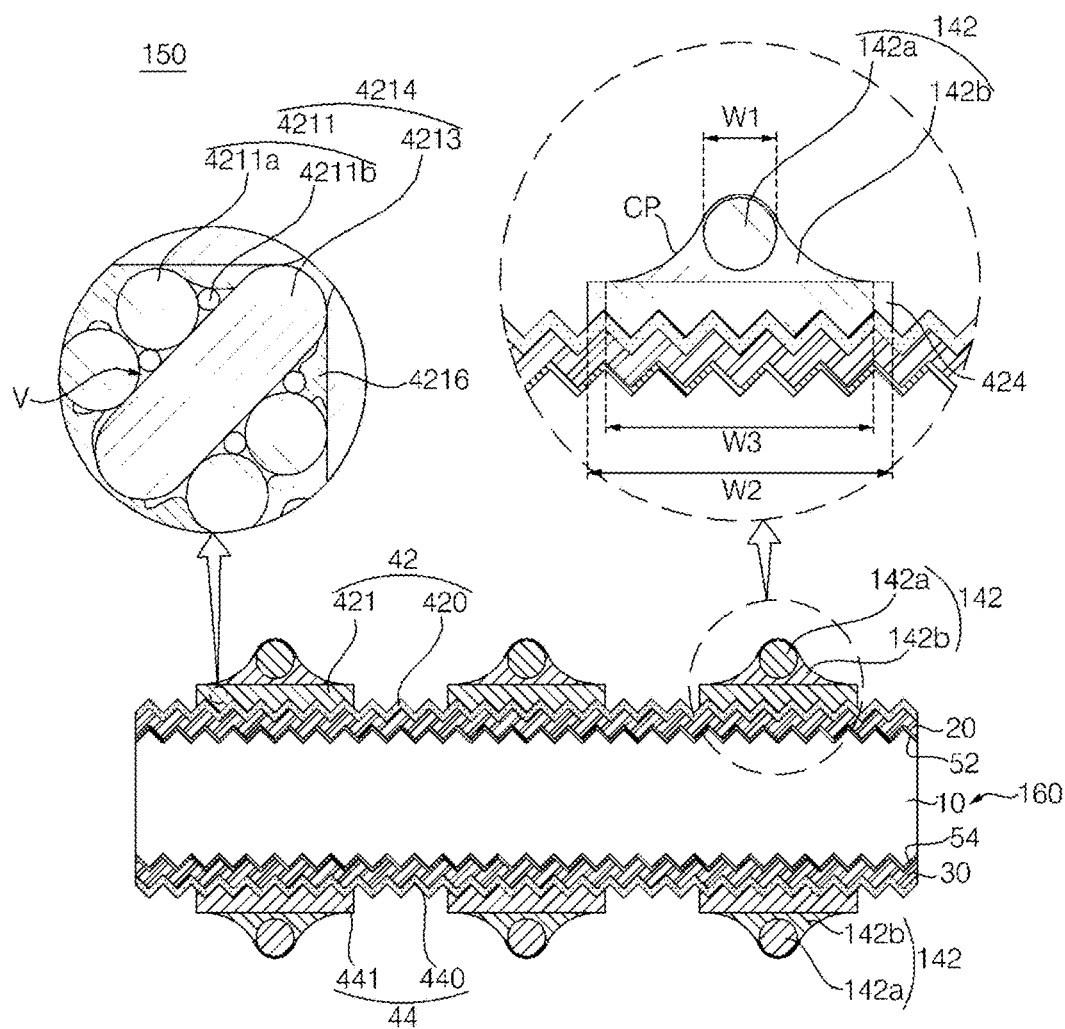
FIG. 5 is a partial cross-sectional view of a solar cell and leads connected thereto, which are included in the solar cell panel shown in FIG. 1.

FIG. 3 is a perspective view of a first solar cell 151 and a second solar cell 152 connected by the leads 142, which are included in the solar cell panel 100 shown in FIG. 1, and FIG. 4 is a cross-sectional view taken along line IV-IV in FIG. 3. FIG. 5 is a partial cross-sectional view of the solar cell 150 and the leads 142 connected thereto, which are included in the solar cell panel 100 shown in FIG. 1. In FIG. 3 and FIG. 4, the first and second solar cells 151 and 152 are briefly illustrated mainly in conjunction with a semiconductor substrate 160 and electrodes 42 and 44 thereof in order to clearly and concisely illustrate them.

With reference to FIG. 3 to FIG. 5, two neighboring solar cells 150 of a plurality of solar cells 150 (for example, the first solar cell 151 and second solar cell 152) may be connected by the leads 142. In this instance, the leads 142 connect a first electrode 42 disposed at the front surface of the first solar cell 151 and a second electrode 44 disposed at the back surface of the second solar cell 152 arranged at one side of the first solar cell 151 (a left lower side of FIG. 5). Other leads 1420a connect the second electrode 44 disposed at the back surface of the first solar cell 151 and the first electrode 42 disposed at the front surface of another solar cell to be arranged at the other side of the first solar cell 151 (a right upper side of FIG. 5). Other leads 1420b connect the first electrode 42 disposed at the front surface of the second solar cell 152 and the second electrode 44 disposed at the back surface of another solar cell to be arranged at one side of the second solar cell 152 (the left lower side of FIG. 5). Thus, the plurality of solar cells 150 may be connected by the leads 142, 1420a and 1420b, to form one solar cell string. The following descriptions of leads 142 may be applied to all leads 142, 1420a, 1420b connecting two neighboring solar cells 150.

The lead 142 may be arranged to extend across the first solar cell 151 along a portion of the first solar cell 151 where the first electrodes 42 are positioned while extending across the second solar cell 152 along a portion of the second solar cell 152 where the second electrodes 42 are positioned. The leads 142 having a width W1 smaller than a width of the first and second solar cells 151 and 152 can effectively connect the first and second solar cells 151 and 152 in spite of a small area thereof. For example, the lead 142 may be positioned only in regions corresponding to bus bars 423 (shown in FIG. 6) of the first or second electrodes 42 or 44.

With reference to one surface of each solar cell 150, a plurality of leads 142 is provided, and thus, electrical connection characteristics between the adjacent solar cells 150 can be enhanced. In particular, in the embodiment, each lead 142 is constituted by a wire having a small width W1 and longitudinally extending in one direction. The width W1 of the lead 142 is smaller than that of a conventionally-used ribbon, which has a relatively great width (for example, 1 to 2 mm). Thus, a number of the leads 142 may be greater than a number of conventionally-used ribbons (for example, two to five) with reference to one surface of each solar cell 150.

As an example, each lead 142 may include a core layer 142a made of a metal, and a solder layer 142b coated on an outer surface of the core layer 142a with a small thickness and including a solder material so as to enable the soldering with the electrodes 42 and 44. As an example, the core layer 142a may include Ni, Cu, Ag, or Al as a major material thereof (for example, a material having a content of 50 wt % or more, in more detail, a material having a content of 90 wt % or more). The solder layer 142b may be formed of an alloy including at least one of Sn, Pb, Ag, Bi, and In. As an example, the solder layer 142b may be formed of Pb, Sn, SnIn, SnBi, SnBiPb, SnPb, SnPbAg, SnCuAg or SnCu as a major material thereof. However, the embodiments of the invention are not limited to the above-described materials and the core layer 142a and the solder layer 142b may include any of various materials.

As stated in the above, when the wire, which has a smaller width W1 than the conventional ribbon, is used as the lead 142, material costs may be greatly reduced. Since the lead 142 has a smaller width W1 than the ribbon, a sufficient number of leads 142 can be included in each solar cell 150, and thus, the movement distance of carriers may be minimized. Accordingly, output power of the solar cell panel 100 can be enhanced.

The wire constituting the lead 142 in accordance with this embodiment may have a rounded portion. That is, the wire constituting the lead 142 may have a circular or oval cross-section, a curved cross-section, or a round cross-section. Then, the lead 142 can induce reflection or diffuse reflection. Accordingly, the light reflected from the round portion of the wire constituting the lead 142 may be reflected or totally reflected upon the front substrate 110 or the back substrate 120 disposed at the front surface or the back surface of the solar cell 150, and thus, may be again incident on the solar cell 150. Thus, the output power of the solar cell panel 100 can be effectively enhanced. Also, the wire having the above structure can be easily manufactured. However, the embodiments of the invention are not limited to the above-described shape, and the wire constituting the lead 142 may have a quadrangular shape or a polygonal shape. The wire may also have any of various other shapes.

In the embodiment, the lead 142 may have the width W1 of 100 um to 500 um. In the specification, the width W1 of the lead 142 may mean the width or diameter of the lead 142 or the core layer 142a in a plane perpendicular to a thickness direction of the solar cell 150 while passing through a center of the lead 142. For reference, the solder layer 142b has a very small thickness at a portion thereof disposed at the center of the core layer 142a after attaching the lead 142 on the electrodes 42 and 44, and thus, has little influence on the width W1 of the lead 142.

By virtue of the lead 142, which has a wire structure while having the above-described width, it may be possible to effectively transfer current generated in the solar cell 150 to the outside of the solar cell 150 (for example, a bus ribbon or a bypass diode of a junction box) or to another solar cell 150. When the width W1 of the lead 142 is less than 100 μm, the strength of the lead 142 may be insufficient. In addition, the lead 142 may exhibit inferior electrical connection characteristics and low attachment force because the connection area of the lead 142 to the electrodes 42 and 44 is too small. On the other hand, when the width W1 of the lead 142 is greater than 500 μm, the material cost of the lead 142 may increase. In addition, the lead 142 may obstruct incidence of light upon the front surface of the solar cell 150, and thus, shading loss may increase. In addition, force applied to the lead 142 in a direction away from the electrodes 42 and 44 may increase, and thus, attachment force between the lead 142 and the electrodes 42 and 44 may be reduced. In severe instances, cracks or the like may be generated at the electrodes 42 and 44 or the semiconductor substrate 160. For example, when considering the attachment force more, the width W1 of the lead 142 may be 250 to 500 μm. In this range, both of the output power and the attachment force to the electrodes 42 and 44 may be enhanced.

In the embodiment, the leads 142 may be separately or individually fixed to the electrodes 42 and 44 of the solar cell 150 by the soldering layer 142b in the state that the lead 142 is not inserted into or covered with a separate layer or film or the like. Thereby, the solder layer 142b on the electrodes 42 and 44 has a unique shape after attaching the lead 142 to the electrode 42 and 44, and this will be described in more detail later.

In this instance, the width W1 of the leads 142 may be smaller than a pitch P of the finger lines 427 while being greater than a width of the finger lines 427. However, the embodiments of the invention are not limited to such conditions, and various variations are possible.

A plurality of the leads 142 are arranged with a regular interval. The number of leads 142 in one surface of the solar cell 150 may be 6 to 38 (for example, 11 to 30). When the number of the leads 142 is less than 6, the output power of the solar cell panel 100 may not largely increase. Meanwhile, it may be difficult to increase the output power of the solar cell panel 100 even though the number of leads 142 exceeds the predetermined number. Also, when the number of leads 142 increases, load on the solar cell 150 may be increased. In this regard, the number of leads 142 may be equal to or less than 38. In order to further enhance the output power of the solar cell panel 100, the number of leads 142 may be equal to or greater than 11. In order to decrease the load on the solar cell, the number of leads 142 may be equal to or less than 30.

Referring to FIG. 5, the solar cell 150 according to the embodiment includes a semiconductor substrate 160 including a base region 10, a first passivation layer 52 on a front surface of the semiconductor substrate 160, a second passivation layer 54 on a back surface of the semiconductor substrate 160, a first conductivity type regions 20 formed on the first passivation layer 52 at the front surface of the semiconductor substrate 160, a second conductivity type regions 30 formed on the second passivation layer at the back surface of the semiconductor substrate 160, a first electrode 42 connected to the first conductivity type regions 20, and a second electrode 45 connected to the second conductivity type regions 30. This will be described in more detail.

The semiconductor substrate 160 may be made of a semiconductor of a crystalline structure including a first or second dopant, which is a base dopant, with a low concentration to have a first or second conductivity type. For example, the semiconductor substrate 160 may be made of a single-crystalline or polycrystalline semiconductor (for example, a single-crystalline or polycrystalline silicon). In particular, the semiconductor substrate 160 may be made of a single-crystalline semiconductor (for example, a single-crystalline semiconductor wafer, in more detail, a single-crystalline silicon wafer). When the semiconductor substrate 160 having high crystallinity with low defect is used, the solar cell 150 may have excellent electrical characteristics. In this instance, the semiconductor substrate 160 may be only formed of the base region 10 without a doping region that is formed by an additional doping or so on. Thereby, decrease in the passivation property of the semiconductor substrate 160 due to the doping region can be prevented or reduced.

The front and/or back surface of the semiconductor substrate 160 may have an uneven surface structure having protrusions and grooves through texturing. For example, the protrusions and grooves have a pyramid shape having four outer surfaces constituted by (111)-oriented surfaces of the semiconductor substrate 160. When the surface of the semiconductor substrate 160 has the uneven surface structure having the protrusions and the grooves through the texturing, it may be possible to reduce reflectance of light incident to the semiconductor substrate 160. Accordingly, shading loss may be effectively minimized. However, the embodiments of the invention are not limited to the above-described structure. The semiconductor substrate 160 may not have, at the front and back surfaces thereof, protrusions and grooves formed through texturing.

The first passivation layer 52 is formed on (for example, is in contact with) the front surface of the semiconductor substrate 160, and the second passivation layer 54 is formed on (for example, is in contact with) the back surface of the semiconductor substrate 160. Thereby, passivation property can be enhanced. In this instance, the first and second passivation layers 52 and 54 may be entirely formed throughout the front and back surfaces of the semiconductor substrate 160, respectively. Consequently, the passivation property is improved and the first and second passivation layers 52 and 54 may be easily formed without additional patterning. Since carriers are delivered to the first or second conductivity type regions 20 or 30 through the first or second passivation layer 52 or 54, a thickness of each of the first and second passivation layers 52 and 54 may be smaller than a thickness of each of the first conductivity type region 20 and the second conductivity type region 30.

For example, the first and second passivation layers 52 and 54 may be formed of an intrinsic amorphous semiconductor layer (for example, an intrinsic amorphous silicon (i-a-Si) layer). Then, the first and second passivation layers 52 include a semiconductor material the same as that of the semiconductor substrate 160 and thus have properties similar to the semiconductor substrate 160, thereby effectively enhancing the passivation property. Accordingly, the passivation property can be largely enhanced. However, the embodiments of the invention are not limited thereto. Thus, the first and second passivation layers 52 and 54 may include an intrinsic amorphous silicon carbide (i-a-SiCx) layer, an intrinsic amorphous silicon oxide (i-a-SiOx) layer, and so on. According to this, the effect due to the broad energy band gap can be enhanced, while the passivation property may be slightly lower than the passivation property in the instance including the intrinsic amorphous silicon (i-a-Si) layer.

The first conductivity type region 20 having the first conductivity type dopant or having the first conductivity type with a doping concentration higher than a doping concentration of the semiconductor substrate 160 may be positioned on (for example, be in contact with) the first passivation layer 52. The second conductivity type region 30 having the second conductivity type dopant having the second conductivity type opposite to the first conductivity type or having the second conductivity type may be positioned on (for example, be in contact with) the second passivation layer 54. When the first and second passivation layers 52 and 54 are in contact with the first and second conductivity type regions 20 and 30, respectively, the transmitted path of carrier can be shortened and the structure of the solar cell 150 can be simplified.

Because the first conductivity type region 20 and the second conductivity type region 30 are separate layers from the semiconductor substrate 160, the first conductivity type region 20 and the second conductivity type region 30 may have a different material and/or a different crystal structure from that of the semiconductor substrate 160 so as to be easily formed on the semiconductor substrate 160.

For example, each of the first conductivity type region 20 and the second conductivity type region 30 may be formed by doping a semiconductor of an amorphous structure that may be easily manufactured by various methods such as deposition and the like, with the first or second conductivity type dopant. Then, the first conductivity type region 20 and the second conductivity type region 30 can be easily formed by a simple process.

In this instance, the semiconductor substrate 160 may have the first conductivity type. Then, the first conductivity type region 20 constitutes a front surface field region having a conductivity type the same as that of the semiconductor substrate 160 with a higher doping concentration than the semiconductor substrate 160, and the second conductivity type region 30 constitutes an emitter region having a conductivity type opposite to that of the semiconductor substrate 160. Then, the second conductivity type region 30, which is the emitter region, is positioned at the back surface of the semiconductor substrate 160 and does not disturb the light incident to the front surface, and thus, the second conductivity type region 30 may be relatively thick. Also, the first conductivity type region 20, which is the front surface field region, is positioned at the front surface of the semiconductor substrate 160 and has an influence on the light incident to the front surface, and thus, the first conductivity type region 20 may be relatively thin. Accordingly, the light loss due to the first conductivity type region 20 can be minimized.

As the first or second conductivity type dopant, a Group-III element such as boron (B), aluminum (Al), gallium (Ga), or indium (In) may be used for the p-type dopant, and a Group-V element such as phosphorous (P), arsenic (As), bismuth (Bi) or antimony (Sb) may be used for the n-type dopant. Various dopants besides the above may be used for the first or second conductivity type dopant.

For example, the semiconductor substrate 160 and the first conductivity type region 20 may be of an n-type and the second conductivity type region 30 may be of a p-type. When the semiconductor substrate 160 is of the n-type, life time of the carrier can be enhanced. For example, the semiconductor substrate 160 and the first conductivity type region 20 may have phosphorus (P) as the n-type dopant and the second conductivity type region 30 may have boron (B) as the p-type dopant. However, the embodiments of the invention are not limited thereto, and thus, the first conductivity type may be the p-type and the second conductivity type may be the n-type.

In the embodiment, the first conductivity type region 20 or the second conductivity type region 30 may include at least one of an amorphous silicon (a-Si) layer, an amorphous silicon oxide (a-SiOx) layer, an amorphous silicon carbide (a-SiCx) layer, an indium-gallium-zinc oxide (IGZO) layer, a titanium oxide (TiOx) layer, and a molybdenum oxide (MoOx) layer. In this instance, the amorphous silicon (a-Si) layer, the amorphous silicon oxide (a-SiOx) layer, or the amorphous silicon carbide (a-SiCx) layer may be doped with the first or second conductivity type dopant. The indium-gallium-zinc oxide (IGZO) layer, the titanium oxide (TiOx) layer, or the molybdenum oxide (MoOx) layer need not include the dopant, and may selectively collect electrons or holes itself and thus may act as the n-type region and the p-type region. As an example, each of the first and second conductivity type regions 20 and 30 may be an amorphous silicon layer. Then, the first and second conductivity type regions 20 and 30 include a material (that is, silicon) the same as the semiconductor material of the semiconductor substrate 160, and therefore, may have properties similar to those of the semiconductor substrate 160. Accordingly, carriers can be effectively and stably transferred and a stable structure can be achieved.

The first electrode 42 electrically connected to the first conductivity type region 20 is positioned on (for example, is in contact with) the first conductivity type region 20, and the second electrode 44 electrically connected to the second conductivity type region 30 is positioned on (for example, is in contact with) the second conductivity type region 30.

The first electrode 42 includes a first metal electrode layer 421 where the lead 142 or the solder layer 142b is adhered or connected, and may further include a first transparent electrode layer 420 between the first conductivity type region 20 and the first metal electrode layer 421.

In this instance, the first transparent electrode layer 420 may be entirely positioned on (for example, entirely in contact with) the first conductivity type region 20. Here, the expression "a film or layer formed entirely positioned on an element" includes an instance where the film or layer is physically completely formed on a whole portion of the element and an instance where the film or layer is inevitably formed on all except for a small portion of the element. As such, when the first transparent electrode layer 420 is entirely positioned on the first conductivity type region 20, the carriers can easily reach the first metal electrode layer 421 through the first transparent electrode layer 420, and thus, lateral electrical resistivity can be reduced. Since the first conductivity type region 20 formed of the amorphous semiconductor layer and so on has relatively low crystallinity and thus the mobility of the carrier may be low, the lateral electric resistivity of the carrier is reduced by the first transparent electrode layer 420.

As stated in the above, the first transparent electrode layer 420 is entirely positioned on the first conductivity type region 20, and therefore, the first transparent electrode layer 420 may be formed of an optically transparent material. As an example, the first transparent electrode layer 420 may include at least one of an indium tin oxide (ITO), an aluminum zinc oxide (AZO), a boron zinc oxide (BZO), an indium tungsten oxide (IWO), and an indium cesium oxide (ICO). However, the embodiments of the invention are not limited thereto, and thus, the first transparent electrode layer 420 may include another material not stated in the above.

In this instance, according to the embodiment, the first transparent electrode layer 420 may include the optically transparent material as a main material, and may further include hydrogen. When the first transparent electrode layer 420 includes the hydrogen, the mobility of electron or hole can be improved and a transparent property of the first transparent electrode layer 420 can be enhanced.

As an example, the first transparent electrode layer 420 may have a thickness the same as or greater than a thickness of the first conductivity type region 20 (or the second conductivity type region 30). Specifically, the first transparent electrode layer 420 may have the thickness larger than the thickness of the first conductivity type region 20 (or the second conductivity type region 30). Thereby, the carrier can be smoothly transferred through the first transparent electrode layer 420.

In the embodiment, the first metal electrode layer 421 having a predetermined pattern may be positioned on the first transparent electrode layer 420. As an example, the first metal electrode layer 421 is in contact with the first transparent electrode layer 420, and thus, the structure of the first electrode 42 can be simplified. However, the embodiments of the invention are not limited thereto.

The first metal electrode layer 421 that is positioned on the first transparent electrode layer 420 and the lead 142 is connected thereto may include a metal and a cross-linking resin. The first metal electrode layer 421 includes the metal, and thus, carrier collection efficiency can be enhanced and electric resistivity can be reduced.

Since the first metal electrode layer 421 including the metal may prevent a light from being incident to the solar cell 150, the first metal electrode layer 421 may have a predetermined shape in order to minimize shading loss. Thereby, the light can be incident to the solar cell 150 through a portion where the first metal electrode layer 421 is not formed. A planar shape of the first metal electrode layer 421 will be described in more detail later with reference to FIG. 6.

The second electrode 44 includes a second metal electrode layer 441 where the lead 142 is adhered or connected, and may further include a second transparent electrode layer 440 between the second conductivity type region 30 and the second metal electrode layer 421. Since a function, a material, a shape, and so on of the second transparent electrode layer 440 and the second metal electrode layer 441 of the second electrode 44 are the same as a function, a material, a shape, and so on of the first transparent electrode layer 420 and the first metal electrode layer 421 of the first electrode 42, the descriptions on the first transparent electrode layer 420 and the first metal electrode layer 421 of the first electrode 42 may be applied to the second transparent electrode layer 440 and the second metal electrode layer 441 as is, except for the fact that the second electrode 44 is located on the second conductivity type regions 30.

In this instance, in the embodiment, the first or second metal electrode layer 421 or 441 where the lead 142 is adhered may be formed of a material being able to prevent the solder layer 142b from penetrating and to be fired by a low-temperature firing (as an example, a firing at a temperature of 300° C. or less). As an example, the first and second metal electrode layers 421 and 441 need not include glass frit formed of metal compounds (as an example, an oxide including oxygen, a carbide including carbon, a sulfide including sulfur). Therefore, the first and second metal electrode layers 421 and 441 may include metal particles 4214 and the cross-linking resin 4216, and may further include another resin (as an example, a hardener, an additive).

In the embodiment, since the first and second metal electrode layers 421 and 441 are in contact with the first and second transparent electrode layers 420 and 440, a fire-through process where the first and second metal electrode layers 421 and 441 penetrate through an insulating layer or so on is not necessary. Accordingly, the first and second metal electrode layers 421 and 441 may be formed by coating (as an example, printing) a low-temperature firing paste and then heat-treating the low-temperature firing paste. When the low-temperature firing paste or the first and second metal electrode layers 421 and 441 do not include the glass frit, the first and second metal electrode layers 421 and 441 may have electrical conductivity by the metal particles 4214 simply cured to be in contact with and be aggregated with each other. That is, the metal particles 4214 of the first and second metal electrode layers 421 and 441 are not sintered.

In the first and second metal electrode layers 421 and 441 formed by the simple curing, a part of portions between the metal particles 4214 may be filled with the cross-linking resin 4216 and the other part between the metal particles 4214 has voids v that are left after the curing. Thus, the first and second metal electrode layers 421 and 441 may have a void ratio (or porosity) greater than that of the solder layer 142b not having the voids v. By the difference in the void ratio, it can be seen that the first and second metal electrode layers 421 and 441 include the cross-linking resin 4216 but do not include the glass frit.

The metal particles 4214 may include at least one of various materials having electric conductivity. As an example, the metal particles 4214 may include one of silver (Ag) particles, aluminum (Al) particles, copper (Cu) particles, and silver, aluminum, or copper particles coated with silver or tin (Sn), or a mixture including at least two particles thereof.

The cross-linking resin 4216 may include a material for inducing cross-linking between the metal particles 4214 and thus preventing the solder layer 142b from penetrating into the first and second metal electrode layers 421 and 441. If the cross-linking resin 4216 is not included unlike the embodiment, the solder layer 142b penetrates into the first and second metal electrode layers 421 and 441, the first and second metal electrode layers 421 and 441 are brittle, and the first and second metal electrode layers 421 and 441 may be easily broken by a small impact. In the embodiment, it is expected that the cross-linking resin 4216 fills between the metal particles 4214 and thus prevents the penetration of the solder layer 142b. For example, the cross-linking resin 4216 may include a phenoxy-based resin, an epoxy-based resin, a cellulose-based resin, or so on. These have good properties of cross-linking, and do not change properties of the first and second metal electrode layers 42 and 44. Particularly, the properties of cross-linking can be enhanced more by using the epoxy-based resin. Also, the first and second metal electrode layers 421 and 441 may further include a hardener. An amine-based hardener may be used as the hardener. For example, phthalic anhydride, diethylamino propylamine, or diethylene triamine may be used for the amine-based hardener. Further, the first and second metal electrode layers 421 and 441 may include other additives.

Although the low-temperature firing paste for forming the first and second metal electrode layers 421 and 441 includes a solvent, the first and second metal electrode layers 421 and 441 does not include the solvent or includes the solvent with a very small amount since the solvent volatilizes during a heat-treatment. An organic solvent may be used for the solvent. For example, butyl carbitol acetate (BCA), cellulose acetate (CA), or so on may be used for the organic solvent. However, the embodiments of the invention are not limited thereto.

In this instance, an amount of the metal or the metal particles 4214 is greater than an amount of the cross-linking resin 4216 in the first or second metal electrode layer 421 or 441. Thereby, the first or second metal electrode layer 421 or 441 has sufficient electric conductivity. For example, with respect to 100 parts by weight of a sum of the metal particles 4214 and the cross-linking resin 4216, the metal particles 4214 is included by 80 to 95 parts by weight, the cross-linking resin 4216 is included by 5 to 20 parts by weight, and the hardener is included by 0.1 to 5 parts by weight. With respect to 100 parts by weight of the sum of the metal particles 4214 and the cross-linking resin 4216, the solvent is included 3 to 10 parts by weight before a heat-treatment, while the solvent is not included or is included with a very small amount after the heat-treatment since the solvent volatilizes. Since an amount of the other materials such as the hardener and so on is small after the heat-treatment, the metal or the metal particles 4214 may be included by 80 to 95 parts by weight in the first or second metal electrode layer 421 or 441.

If the metal particles 4214 are included less than 80 parts by weight or the cross-linking resin 4216 is included more than 20 parts by weight, the electric conductivity due to the metal particles 4214 may be not sufficient. If the metal particles 4214 are included more than 95 parts by weight or the cross-linking resin 4216 is included less than 5 parts by weight, the effect of preventing the penetration of the solder layer 142b may be not sufficient because the amount of the cross-linking resin 4216 is not sufficient. The above amount of the hardener may be limited not to deteriorate properties of the low-temperature firing paste and limited to perform sufficient curing. The above amount of the solvent may be limited to uniformly mixing various materials and to easily volatilize during the heat-treatment not to deteriorate electrical properties. However, the embodiments of the invention are not limited to above values.

In the embodiment, the metal particles 4214 may include first-shaped particles 4211 and second-shaped particles 4213 having different shapes from each other. Then, a filling ratio of the metal particles 4214 can increase and the solder layer 142b can be effectively prevented from penetrating into the first and second metal electrode layers 421 and 441. For example, the first-shaped particles 4211 may have a spherical shape, and the second-shaped particles 4213 may have a non-spherical shape (as an example, a flake shape). Then, the filling ratio can be increase by the first-shaped particles 4211, and also, the penetration of the solder layer 142b can be prevented by the second-shaped particles 4213. In this instance, an amount of the first-shaped particles 4211 is greater than an amount of the second-shaped particles 4213. Due to the large amount of the first-shaped particles 4211 of the spherical shape, the electric conductivity can be enhanced. The second-shaped particles 4213 may be included with a relatively small amount only to prevent the penetration of the solder layer 142b. For example, with respect to 100 parts by weight of the metal particles 4214, the first-shaped particles 4211 may be included by 70 to 99 parts by weight, and the second-shaped particles 4213 may be included by 1 to 30 parts by weight. These ranges may be limited to realize enhanced electric conductivity and to effectively prevent the penetration of the solder layer 142b. However, the embodiments of the invention are not limited the values. Also, the metal particles 4214 may include the first-shaped particles 4211 only without the second-shaped particles 4213.

In this instance, a size (for example, a diameter, more particularly, an average diameter) of the first-shaped particles 4211 may be smaller than a long width (for example, an average long width) of the second-shaped particles 4213 and may be the same as or greater than a thickness (for example, an average thickness) of the second-shaped particles 4213. Or, the first-shaped particles may have the size (for example, the average diameter) of 0.1 to 5 um, and the second-shaped particles may have the long width (for example, the average long width) of 2 to 10 um and the thickness (for example, the average thickness) of 0.2 to 5 um. When the first-shaped particles 4211 and the second-shaped particles 4213 are included together, the metal particles 4214 can be densely filled and the penetration of the solder layer 142b can be prevented by the second-shaped particles 4213. In this instance, at least a part or some of the second-shaped particles 4213 may have a size (for example, a long width) greater than a thickness of the solder layer 142b. Then, the penetration of the solder layer 142b can be effectively prevented. Also, the metal particles 4214 or the first-shaped particles 4211 may include first particles 4211a having a spherical shape and a first size and second particles 4211b having a spherical shape and a second size different from the first size. When the first-shaped particles 4211 include the first particles 4211a and the second particles 4211b, a void v inside the first and second metal electrode layers 421 and 422 can be minimized. For example, the first size of the first particles 4211a may be 0.2 to 1 um, and the second size of the second particles 4211b may be 2 to 3 um. In this instance, an amount of the second particles 4211b may be smaller than an amount of the first particles 4211a. When the amount of the first particles 4211a having the relatively small size is greater than the amount of the second particles 4211b, the void v can easily decrease. For example, with respect to 100 parts by weight of the first-shaped particles 4211, the first particles 4211a may be included by 60 to 95 parts by weight, and the second particles 4211b may be included 5 to 40 parts by weight. These ranges are limited to minimize the void v, however, the embodiments of the invention are not limited thereto.

For reference, the size of the first-shaped particles 4211 may be measured or decided by using a particle size analyzer or a scanning microscopy (SEM), and the long width and the thickness of the second-shaped particles 4213 may be measured or decided by using a scanning microscopy (SEM).

As such, in the embodiment, each of the first and second metal electrode layers 421 and 441 includes the cross-linking resin 4216, along with the metal particles 4214, and thus, an amount of a metal in the solder layer 142b formed of the metal is larger than an amount of a metal in the first and second metal electrode layers 421 and 441. The soldering property can be enhanced by the solder layer 142b having the large amount of the metal, and the penetration of the solder layer 142b can be prevented by the cross-linking resin 4216 in the first and second metal electrode layers 421 and 441. For example, the metal is included by 99 parts by weight with respect to 100 parts by weight of the solder layer 142b. On the other hand, as stated in the above, the metal (or the metal particles 4214) may be included by 80 to 95 parts by weight with respect to 100 parts by weight of the first or second metal electrode layer 421 or 441.

Shapes of the first and second metal electrode layers 421 and 441 of the first and second electrodes 42 and 44, and the lead 142 and/or the solder layer 142b adhered thereto will be described in more detail with reference to FIG. 6 and FIG. 7, along with FIG. 5.

Figure 6:
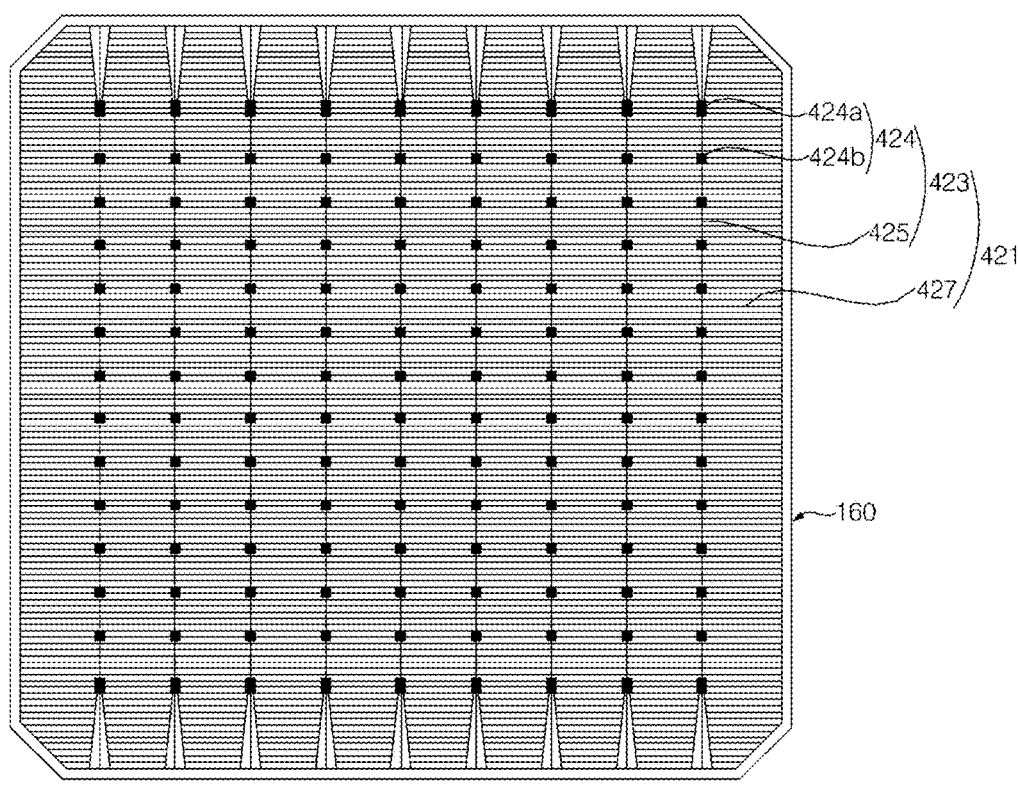
FIG. 6 is a plan view of a solar cell included in the solar cell panel shown FIG. 1.

FIG. 6 is a plan view illustrating the solar cell 150 included in the solar cell panel 100 shown FIG. 1. FIG. 7 is a plan view of the solar cell 150 and the leads 142 connected thereto, which are included in the solar cell panel 100 shown in FIG. 1. In FIGS. 6 and 7, the semiconductor substrate 160 and the first and second metal electrode layers 421 and 441 of the first and second electrodes 42 and 44 are mainly shown. Although the first metal electrode layer 421 of the first electrode 42 will be described below as an example, the following descriptions may be applied to the second metal electrode layer 441 of the second electrode 44 as is.

Figure 7:
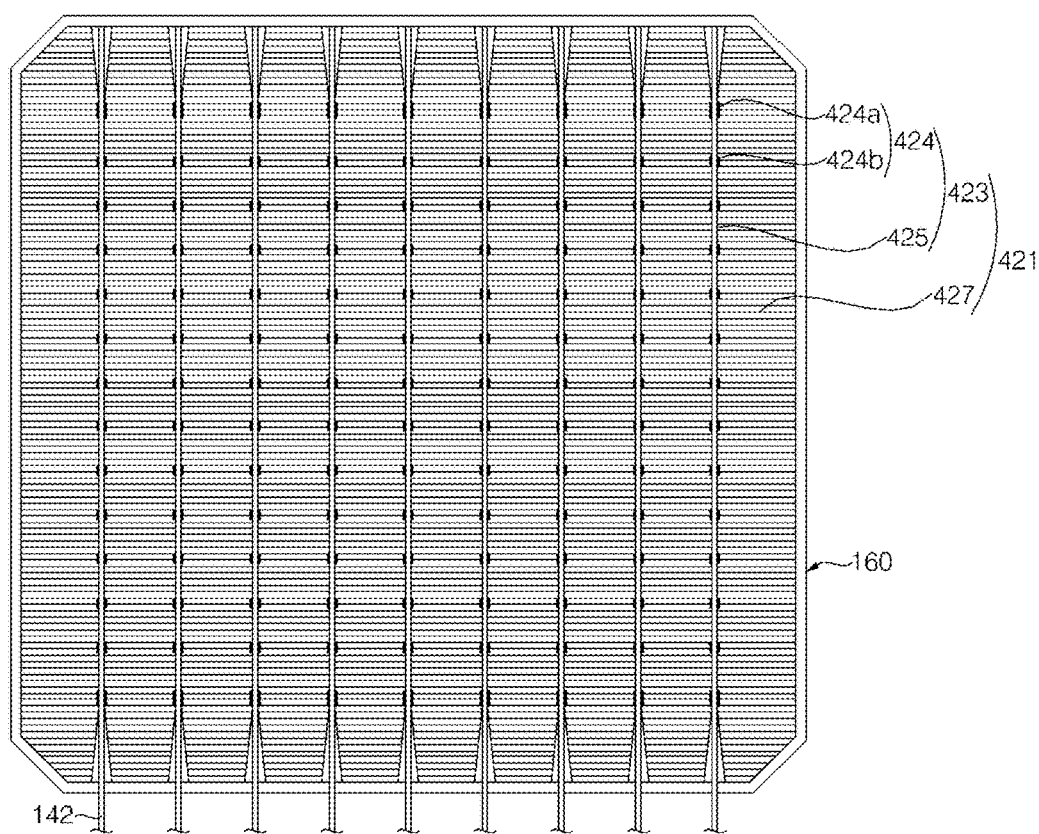
FIG. 7 is a plan view of a solar cell and leads connected thereto which are included in the solar cell panel shown in FIG. 1.

With reference to FIG. 6 and FIG. 7, in the embodiment, the first metal electrode layer 421 includes a plurality of finger lines 427 extended in a first direction (a horizontal direction of the drawings) to be parallel to each other. The first metal electrode layer 421 may further include bus bars 423 extended in a second direction (a vertical direction of the drawings) crossing (as an example, being perpendicular to) the first direction. The lead 142 is connected or adhered to the bus bar 423. The bus bars 423 may be provided to correspond to the leads 142 one to one. Thus, the descriptions regarding the number, pitch, etc. of the bus bars 423 may be applied to the number, pitch, etc. of the leads 142 as is. In the embodiment, since the plurality of leads 142 (for example, six or more) are provided with reference to one surface of the solar cell 150, the plurality of bus bars 423 (for example, six or more) may be provided with reference to one surface of the solar cell 150 to correspond to the leads 142.

For example, a bonding strength between the lead 142 and the bus bar 423 (for example, a pad portion 424) may be 0.5 to 2N. Since the lead 142 can be stably attached to the bus bar 423 (for example, the pad portion 424) by the bonding strength, problems such as a separation of the lead 142 from the bus bar 423 due to an external force can be prevented from occurring.

The plurality of finger lines 427 are spaced apart from one another while having a uniform width and a uniform pitch. In drawings, the finger lines 427 are illustrated as being parallel to each other while being parallel to a main edge of the solar cell 150 as an example. However, the embodiments of the invention are not limited thereto.

As an example, the bus bar 423 may include a pad portion 424 at a region where the lead 142 is connected or adhered. The pad portion 424 may have a width W2 larger than a width of the solder layer 142b. Since the pad portion 424 has the relatively large width W2, the lead 142 can be stably adhered to the pad portion 424 and the contact resistivity between the lead 142 and the bus bar 423 can be reduced. The pad portion 424 may include a plurality of pad portions 424a and 424b are spaced from each other with a regular interval to correspond to the lead 142. As an example, the plurality of pad portions 424a and 424b may include first pad portions 424a disposed at opposite ends of the bus bar 423 and second pad portions 424b other than the first pad portions 424a. The first pad portions 424a have a length and/or a width greater than a length and/or a width of the second pad portions 424b, respectively, because the force for separating the lead 142 from the solar cell 150 may be applied to the first pad portions 424a more than the second pad portions 424b. The width W2 of the pad portion 424, measured in the first direction, may be larger than each of a width of a line portion 425, measured in the first direction, and a width of the finger line 427, measured in the second direction.

In this instance, a thickness of the solder layer 142b is small, more particularly, the thickness of the solder layer 142b is 20% or less the width or the diameter of the core layer 142a (as an example, equal to or less than 20 μm, for example, 2 to 20 μm, as an example, 5 to 20 μm). When the thickness of the solder layer 142b is less than 2 μm, it may be impossible to smoothly carry out a tabbing process. In this instance, a ratio of a width or diameter of the core layer 142a:a thickness of the solder layer 142b may be 1:0.01 to 1:0.04. Here, the thickness of the solder layer 142b at the portion attached to the bus bar 423 by the tabbing process may be varied depending on the position. Accordingly, the thickness of the solder layer 142b may be a thickness of a portion where the tabbing process is not performed (for example, a portion located between the first solar cell 151 and the second solar cell 152). For reference, when the thickness of the solder layer 142b is greater than 20 μm, material costs may increase. Furthermore, the strength of the lead 142 may be reduced due to a reduction in width of the core layer 142a. For reference, the first and second metal electrode layers 421 and 441 may thicker than the solder layer 142b. For example, the first and second metal electrode layers 421 and 441 may have a thickness of 20 to 40 um. In the thickness, electric resistivity of the first and second metal electrode layers 421 and 441 can decrease and the lead 142 can be stably attached to the first and second metal electrode layers 421 and 441.

In this instance, the solder layer 142b of each lead 142 is separately positioned with another lead 1421 or another solder layer 142b. When the lead 142 is attached to the solar cell 150 in accordance with the tabbing process, each of the solder layer 142b entirely flows toward the first or second electrode 42 or 44 (more particularly, to the pad portion 424). Thus, the width of the solder layer 142b may gradually increase toward the pad portion at a portion of the solder layer 142b adjacent to the pad portion 424 or at a portion between the pad portion 424 and the core layer 142a. As an example, the portion of the solder layer 142b adjacent to the pad portion 424 has a width W3 the same as or larger than the diameter W1 of the core layer 142a. More particularly, an upper portion of the solder layer 142b positioned over the core layer 142a may have a protruded shape or a convex shape protruding to an outside of the solar cell 150 corresponding to a shape of the core layer 142a. On the other hand, a lower portion of the solder layer 142b or a portion of the solder layer 142b adjacent to the pad portion 424 may include a portion having a concave shape with respect to the outside of the solar cell 150. Thereby, there is an inflection point CP where a curvature varies at a side surface of the solder layer 142b. By the shape of the solder layer 142b, it can be seen that the lead 142 can be individually or separately adhered and fixed by the solder layer 142b without being inserted into or covered with an additional layer, film, and so on. The lead 142 can be fixed to the solder layer 142b without an additional layer, film, or so on, and thus, the lead 142 can be connected to the solar cell 150 through a simple structure and a simple process. Particularly, in the embodiment, the lead 142 having the small width and the rounded shape can be attached without an additional layer, film, or so on (for example, a conductive adhesive film including a resin and a conductive material), and accordingly, the process cost and the process time of the lead 142 can be minimized.

For reference, a portion of the lead 142 between two adjacent solar cells 150 after the tabbing process has a shape the same as or similar to a shape of the lead 142 before the tabbing process.

As such, because the width W3 of the solder layer 142b is the same as or smaller than the width W2 of the pad portion 424, the solder layer 142b is only formed on a surface of the pad portion 424 (an upper surface of the pad portion 424 in an enlarged view of FIG. 5) opposite to the semiconductor substrate 160, while the solder layer 142b is not formed on side surfaces of the pad portion 424. Unlike this instance, if the solder layer 142b is formed on the side surfaces of the pad portion 424, the transparent electrode layers 420 and 440 may be damaged or the solder layer 142b may penetrate between the first and second transparent electrode layers 420 and 440 and the first and second metal electrode layers 421 and 441 and thus the adhesion property between the first and second transparent electrode layers 420 and 440 and the first and second metal electrode layers 421 and 441 may be deteriorated.

For example, a ratio (W1:W3) of the width W1 of the lead 142:the width W3 of the portion of the solder layer 142b adjacent to the pad portion 424 may be in a range of 1:1 to 1:3.33. A ratio (W3:W2) of the width W3 of the portion of the solder layer 142b adjacent to the pad portion 424:the width W2 of the pad portion 424 may be in a range of 1:1 to 1:4.5 (as an example, 1:1.1 to 1:4.5). When the ratio (W3:W2) is less than 1:1, attachment property between the pad portion 424 and the lead 142 may be insufficient. On the other hand, when the ratio (W3:W2) is greater than 1:5, shading loss may be increased and the manufacturing cost of the pad portion 424 may increase because the area of the pad portion 424 is large. When the ratio (W3:W2) is 1:1.1 or more, the width W3 of the portion of the solder layer 142b adjacent to the pad portion 424 is smaller than the width W2 of the pad portion 424, and thus, the solder layer 142b does not flow down to the side surfaces of the pad portion 424 and the solder layer 142b can be stably positioned on the pad portion 424.

However, the embodiments of the invention are not limited thereto. The width W1 of the lead 142, the width W2 of the pad portion 424, and the width W3 of the solder layer 142b may have any of various values.

The bus bar 423 may include a line portion 425 connecting the pad portions 424 and having the width smaller than a width of the pad portion 424. The bus bar 423 may be formed to extend continuously without a cut-off portion by the line portion 425. By virtue of the narrow line portion 425, it may be possible to minimize the area blocking light incident upon the solar cell 150.

In the embodiment, the line portions 425 of the bus bar 423 are illustrated as corresponding to respective leads 142. In more detail, in conventional instances, bus bar electrodes, which correspond to the leads 142 and have a much greater width than the finger lines 427, are provided. In the embodiment, however, the line portions 425 of the bus bars 423, which have a much smaller width than the bus bar electrodes, are provided. In the embodiment, each line portion 425 connects the plurality of finger lines 427, and thus, provides a path, along which bypass of carriers is carried out when a part of the finger lines 427 is short-circuited.

In the specification, the bus bar electrode means an electrode portion formed in a direction crossing the finger lines, to correspond to the respective ribbon, while having a width corresponding to 12 times or more (normally 15 times or more) the width of each finger line. Since the bus bar electrode has a relatively great width, two or three bus bar electrodes are formed at normal instances. Meanwhile, the line portions 425 of the bus bars 423 in the embodiment may mean electrode portions formed in a direction crossing the finger lines 427, to correspond to the respective leads 142, while having a width corresponding to 10 times or less the width of each finger line 427.

For example, the width of the line portion 421 may be 0.5 to 10 times (as an example, 2 to 5 times) the width of each finger line 427. When the ratio is less than 0.5 times, effects of the line portion 425 may be insufficient. On the other hand, when the ratio is greater than 10 times, shading loss may be increased because the width of the line portion 425 is excessively great. In particular, the width of the line portion 421 may be 2 to 5 times the width of each finger line 427, considering electrical characteristics and shading loss. In this range, efficiency of the solar cell 150 may be greatly enhanced.

Meanwhile, the width of the line portion 425 may be equal to or smaller than the width W1 of the lead 142. When the lead 142 has a circular, oval or round shape, the contact width or area of the lower portion of the lead 142 contacting the line portion 425 is not great, and thus, the width of the line portion 425 may be equal to or smaller than the width of the lead 142. When the width of the line portion 425 is relatively small, it may be possible to reduce the material costs of the first electrode 42 through reduction of the area of the first electrode 42.

Meanwhile, the width of the line portion 425 may be 50 to 500 μm. When the width of the line portion 425 is less than 50 μm, electrical characteristics or the like may be degraded because the width of the line portion 425 is small. On the other hand, when the width of the line portion 425 is greater than 500 μm, it may be impossible to greatly enhance contact characteristics to the line portion 425 or the like in spite of an increase in area of the first electrode 42. As a result, shading loss, material costs, etc. may be increased. However, the embodiments of the invention are not limited thereto. Thus, the width of the line portion 425 may be varied within a range capable of minimizing shading loss while effectively transferring current produced through photoelectric conversion.

Meanwhile, the width W2 of each pad portion 424 is greater than the width of the line portion 425 while being equal to or greater than the width W1 of the lead 142. Since the pad portion 424 is a portion to achieve an enhancement in attachment force of the lead 142 through increase of a contact area thereof to the lead 142, the pad portion 424 has the width W2 greater than the width of the line portion 425 while being equal to or greater than the width of the lead 142.

Meanwhile, for example, the width W2 of the pad portion 424 may be 0.2 mm to 2.5 mm (for example, 0.2 mm to 2.0 mm). When the width W2 of the pad portion 424 is less than 0.2 mm, attachment force between the pad portion 424 and the lead 142 may be insufficient because the contact area of the pad portion 424 to the lead 142 is insufficient. On the other hand, when the width W2 of the pad portion 424 is greater than 2.5 mm, shading loss may be increased because the area of the pad portion 424 causing shading loss is increased. For example, the width W2 of the pad portion 424 may be 0.8 to 1.5 mm.

Meanwhile, the pad portion 424 may have a length greater than the width of each finger line 427. For example, the length of the pad portion 424 may be 1 to 5 mm. When the length of the pad portion 424 is less than 1 mm, attachment force between the pad portion 424 and the lead 142 may be insufficient because the contact area of the pad portion 424 to the lead 142 is insufficient. On the other hand, when the length of the pad portion 424 is greater than 5 mm, shading loss may be increased because the area of the pad portion 424 causing shading loss is increased. However, the embodiments of the invention are not limited thereto, and thus, the width W2 and the length of the pad portion 424 may have any of various values. In addition, the bus bar 423 may not include both of the pad portion 424 and the line portion 425 having different widths. For example, the bus bar 423 may include only the line portion 425 having a uniform width or may include only the pad portion 424 having a uniform width.

As another embodiment, it is possible that the line portion 425 and the pad portion 424 are not separately provided, and thus, the bus bar 423 may be entirely formed of the line portion 425 or the pad portion 424.

For example, in the embodiment, a thickness of the finger line 427 and/or a thickness of the bus bar 423 may be 10 um or more. If the thickness of the finger line 427 and/or the thickness of the bus bar 423 may be less than 10 um, the electric property can be deteriorated. Particularly, in the embodiment, since the finger line 427, the bus bar 423, the lead 142, and so on have small widths, it is desirable that the thicknesses of the finger line 427 and the bus bar 423 is more that a predetermined level. For example, the thickness of the finger line 427 may be 10 μm to 40 μm (more particularly, 15 μm to 30 μm), and the thickness of the bus bar 423 may be 10 μm to 50 μm. Within the ranges, a cost according to an amount of electrode materials (as an example, the silver) can be reduced and also the electric property can be sufficiently achieved. In this instance, the thickness of the bus bar 423 may be the same as or larger than the thickness of the finger line 427. Particularly, when the thickness of the bus bar 423 is larger than the thickness of the finger line 427, the electric property can be enhanced more. However, the embodiments of the invention are not limited thereto.

The above description has been given mainly in conjunction with the first metal electrode layer 422 of the first electrode 42 with reference to an enlarged view of FIG. 5, and FIGS. 6 and 7. The second metal electrode layer 441 of the second electrode 44 may include finger lines and bus bars respectively corresponding to the finger lines 427 and bus bars 423 of the first electrode 42. In this instance, the width, pitch, etc. of the finger lines and the bus bars of the second metal electrode layer 441 may be the same or different from the width, pitch, etc. of the finger lines 427 and the bus bars 423 of the first metal electrode layer 421, respectively. For example, considering shading loss, the widths of the finger lines 427 and the bus bars 423 of the first metal electrode layer 421 may be smaller than the widths of the finger lines and the bus bars of the second metal electrode layer 441, respectively, and/or the pitch of finger lines 427 of the first metal electrode layer 421 may be larger than the pitch of the finger lines of the second metal electrode layer 441. Even in this instance, the pitch and the number of bus bars 423 of the first metal electrode layer 421 may be the same as the pitch and the number of the bus bars of the second metal electrode layer 441, respectively. As another embodiment, the second metal electrode layer 441 may have a planar shape different from that of the first metal electrode layer 421. For example, the second metal electrode layer 441 may be entirely formed on the back surface of the semiconductor substrate 160. Other variations are possible.

As described above, in the embodiment, the first and second metal electrode layers 421 and 441, which are opaque, of the first and second electrodes 42 and 44 have predetermined patterns. Thus, the solar cell 150 has a bi-facial structure in which light can be incident upon both the front and back surfaces of the semiconductor substrate 160. Accordingly, the amount of light utilized by the solar cell 150 is increased and, as such, an enhancement in efficiency of the solar cell 150 may be achieved.

In accordance with the embodiment, it may be possible to minimize the loss of light through diffuse reflection, using the wire-shaped leads 142. It may also possible to reduce the movement path of carriers by increasing the number of the leads 142 and reducing the pitch of the leads 142. Accordingly, efficiency of the solar cell 150 and output power of the solar cell panel 100 may be enhanced. Also, the lead 142 can be attached with a simple structure by a simple process by using the solder layer 142b. In addition, since the first and second metal electrode layers 421 and 441 have the metal particles 4214 and the cross-linking resin 4216, problems that may be induced by the penetration of solder layer 142b into the first and second metal electrode layers 421 and 441 can be prevented and thus reliability can be enhanced.

In the embodiment, by applying the lead 142 having the width of 100 μm to 500 μm to the solar cell 150 having the above-described structure, an electrical connection can be possible even the lead 142 is attached or laid on the first or second transparent electrode layer 420 or 440. Since the first or second metal electrode layer 421 or 441 is formed of the low-temperature paste not including the glass frit, grid interruption caused by soldering (GICS) does not occur due to the soldering. More particularly, if a paste including a glass frit for the fire-through is used when a metal electrode layer is formed, the GICS may occur due to the problem that the finger line 427 may be disconnected or damaged during the soldering. On the other hand, the problem can be prevented by using the low-temperature paste not including the glass frit in the embodiment. Even if a problem such as a disconnection of the finger line 427 occurs unintentionally, the electrical connection can be maintained by the first or second transparent electrode layer 420 or 440. The lead 142 is electrically connected to the first or second transparent electrode layer 420 or 440 and thus can collect carriers even in a region where the bus bar 423 is not located (e.g., between a lower end of the bus bar 423 and an edge of the solar cell 150 in FIG. 7), thereby preventing current loss. In contrast, in the instance where the first or second transparent electrode layer 420 or 440 is not provided and an insulating film, an antireflection film, or the like is provided on the conductivity type regions, unlike the present embodiment, the lead 142 is located on the insulating film or the antireflection film, and thus, the carriers cannot be collected and the current may be lost.

That is, according to the embodiment, even if the lead 142 having the small width is applied and an alignment error occurs, the lead 142 is electrically connected to the first or second electrode 42 or 44 stably. Thus, current collection efficiency can be improved and the solar cell 150 can be prevented from being damaged.

In this embodiment, the lead 142 includes the solder layer 142b entirely coated on the surface of the core layer 142a. Heat and pressure are applied while the lead 142 is placed on the solar cell 150, and then, the solder layer 142b coated on the core layer 142a is melted, thereby attaching the lead 142 to the solar cell 150. This can simplify the attaching process. However, the embodiments of the invention are not limited thereto. The solder layer 142b is formed separately from the lead 142 and is placed between the solar cell 150 and the lead 142 and heat and pressure are applied in the process of attaching the lead 142 to attach the lead 142 to the solar cell 150. In this instance, the solder layer 142b may be a soldering paste placed between the solar cell 150 and the lead 142. Various other variations are possible.

Hereinafter, a solar cell according to another embodiment of the invention and a solar cell panel including the same will be described with reference to the accompanying drawings. The above description may be applied to parts identical or similar to those described above in the same manner and, as such, no description will be given of the identical or similar parts, and only parts different from those described above will be described in detail. Combinations of the above-described embodiment, variations thereof, the following embodiment and variations of the following embodiment also fall within the scope of the invention. Although the first electrode 42 is shown and described as an example, the later embodiment and variations thereof may be applied to at least one of the first electrode 42 and the second electrode 44.

Figure 8:
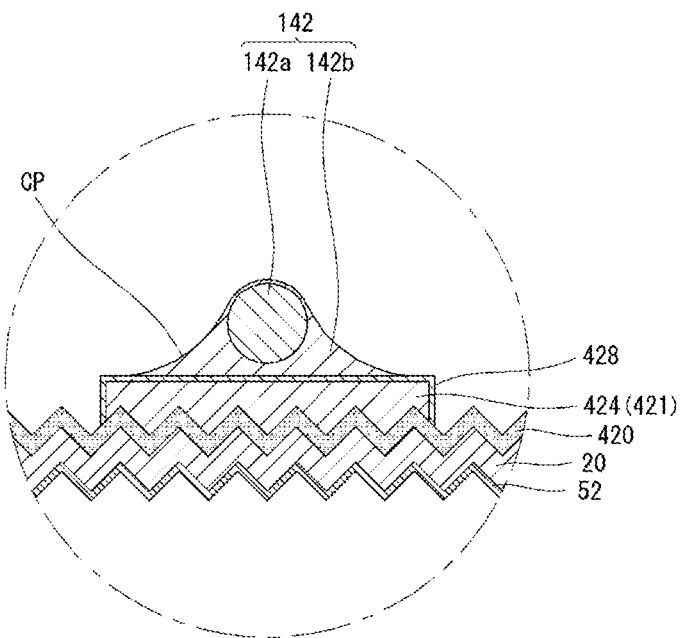
FIG. 8 is an enlarged partial cross-sectional view of a part of a solar cell included in a solar cell panel according to another embodiment of the invention.

FIG. 8 is an enlarged partial cross-sectional view of a part of a solar cell included in a solar cell panel according to another embodiment of the invention. In order to clearly and concisely illustrate a solar cell panel, only a portion corresponding to the enlarged circle in FIG. 5 is shown in FIG. 8.

With reference to FIG. 8, in the embodiment, a barrier electrode portion 428 is formed on a surface of a first metal electrode layer 421 (more particularly, at least a pad portion 424). The barrier electrode portion 428 may include a conductive material (as an example, a metal). In this instance, the barrier electrode portion 428 is formed on an upper surface of the pad portion 424 adjacent to the solder layer 142b (that is, a surface of the pad portion between the pad portion 424 and the solder layer 142b), and may be additionally formed on side surfaces of the pad portion 424. The barrier electrode portion 428 may be formed on a surface of the line portion 425 or may be not formed on the surface of the line portion 425.

Although it is shown that the barrier electrode portion 428 is formed on the upper surface and the side surfaces of the first metal electrode layer 421 in FIG. 8, the embodiments of the invention are not limited thereto. The barrier electrode portion 428 may be only formed on the upper surface of the first metal electrode layer 421, but the barrier electrode portion 428 is not formed on the side surfaces of the first metal electrode layer 421.

The barrier electrode portion 428 blocks a penetration path of the solder layer 142b and thus prevents the penetration of the solder layer 142b. Particularly, in the embodiment, the first transparent electrode layer 420 is included, and thus, the solder layer 142b penetrates between the first transparent electrode layer 420 and the first metal electrode layer 421 and thus the attachment property between the first transparent electrode layer 420 and the first metal electrode layer 421 may be deteriorated during a process of attaching the lead 142 or after the process. Thereby, the first metal electrode layer 421 may be delaminated from the first transparent electrode layer 420 during or after the tabbing process of the lead 142. In the embodiment, the delamination can be prevented by the barrier electrode portion 428. Also, by a simple process for forming the barrier electrode portion 428, the penetration of the solder layer 142b can be prevented, and the electric property of the first electrode is not deteriorated because the barrier electrode portion 428 has the electric conductivity. For example, the barrier electrode portion 428 may include the metal, and thus, the barrier electrode portion 428 may have the electric conductivity higher than that of the first transparent electrode layer 420. However, the embodiments of the invention are not limited thereto.

In the embodiment, it is exemplified that the barrier electrode portion 428 is a layer entirely formed on the upper surface and the side surfaces of the first metal electrode layer 421. In this instance, the barrier electrode portion 428 is entirely positioned on a portion adjacent to the solder layer 142b, and therefore, the penetration of the solder layer 142b can be effectively prevented.

The barrier electrode portion 428 of the above shape can be easily formed by plating. The barrier electrode portion 428 can be selectively formed on a portion where the first metal electrode layer 421 by using the plating, the barrier electrode portion 428 can be formed to have a wanted shape without using an additional mask. Then, the barrier electrode portion 428 does not include a cross-linking resin, and a metal amount of the barrier electrode portion 428 may be larger than a metal amount of the first metal electrode layer 421 and a void ratio of the barrier electrode portion 428 may be smaller than a void ratio of the first metal electrode layer 421. For example, the barrier electrode portion 428 may include silver, titanium, nickel, copper, a nickel-vanadium (NiV) alloy, a titanium-vanadium (TiN) alloy, a titanium-tungsten (TiW) alloy, or an alloy thereof, and the metal is included 99 parts by weight in the barrier electrode portion 428.

However, the embodiments of the invention are not limited thereto. The barrier electrode portion 428 may be formed by various methods, such as, sputtering, spin coating, spray coating, and so on. Other various methods may be applied to form the barrier electrode portion 428. When the barrier electrode portion 428 is formed by the spin coating or the spray coating, the barrier electrode portion 428 is formed of metal particles inside a resin. In this instance, the resin may include an epoxy-based resin, and the metal particle may include a silver particle, a titanium particle, a nickel particle, a copper particle, a particle of nickel-vanadium (NiV) alloy, a particle of a titanium-vanadium (TiN) alloy, a particle of a titanium-tungsten (TiW) alloy, or a particle of an alloy thereof. However, the embodiments of the invention are not limited thereto. Thus, the barrier electrode portion 428 may include any of various materials being able to have electric conductivity and prevent the penetration of the solder layer 142b. A metal amount of the barrier electrode portion 428 may be the same as, be smaller than, or larger than an amount of the first metal electrode layer 421. For example, the metal amount of the barrier electrode portion 428 may be larger than the metal amount of the first metal electrode layer 421 so that the barrier electrode portion 428 can have high electric conductivity. However, the embodiments of the invention are not limited thereto.

A thickness of the barrier electrode portion 428 may be the same as or smaller than a thickness of the first metal electrode layer 421. More particularly, the thickness of the barrier electrode portion 428 may be smaller than the thickness of the first metal electrode layer 421. The barrier electrode portion 428 may be relatively thin because the barrier electrode portion 428 acts to prevent the penetration of the solder layer 142b. The first metal electrode layer 421 may be relatively thick to have sufficient electric property. Or, the thickness of the barrier electrode portion 428 may be 5 nm to 40 μm, and thickness of the first metal electrode layer 421 may be 10 μm to 40 μm. When the thickness of the barrier electrode portion 428 is less than 5 nm, the effect of the barrier electrode portion 428 may be not sufficient. When the thickness of the barrier electrode portion 428 is more than 40 μm, the material cost, the process time, and so on may increase. The thickness of the first metal electrode layer 421 is limited with consideration for the electric conductive property, the material cost, the process time, and so on. However, the embodiments of the invention are not limited thereto. The thickness of the barrier electrode portion 428 and the thickness of the first metal electrode layer 421 may be varied.

On the other hand, the barrier electrode portion 428 may be formed on the pad portion 424 of at least one of the first metal electrode layer 421 and the second metal electrode layer 441. For example, during the attaching process of the lead 142, a temperature of one of the first and second metal electrode layers 421 and 441 may be higher than a temperature of the other of the first and second metal electrode layers 421 and 441. The barrier electrode portion 428 may be formed only on one pad portion 424 of the first and second metal electrode layers 421 and 441, which is located at a higher temperature and is vulnerable to the penetration of the solder layer 142b, while the barrier electrode portion 428 may be not formed on the other pad portion 424 of the first and second metal electrode layers 421 and 441. For example, when the temperature of the first metal electrode layer 421 is higher than the temperature of the second metal electrode layer 441 in the process of attaching the lead 142, the barrier electrode portion 428 may be formed only on the pad portion 424 of the first metal electrode layer 421 and the barrier electrode portion 428 may not be formed on the pad portion 424 of the second metal electrode layer 441.

Figure 9:
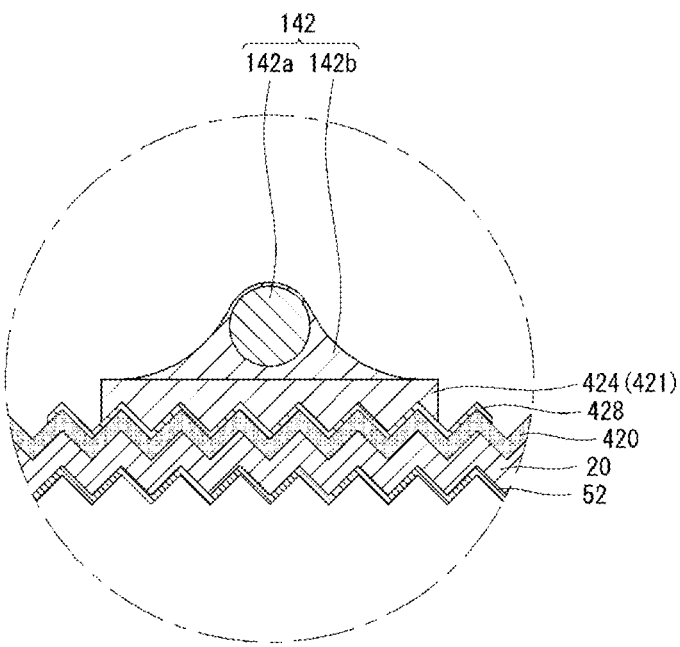
FIG. 9 is an enlarged partial cross-sectional view of a part of a solar cell included in a solar cell panel according to a modified embodiment of the invention.

The shape, the position, and so on of the barrier electrode portion 428 is not limited to the above, and thus, may be variously modified. Various modifications will be described in more detail with reference to FIG. 9 to FIG. 13. FIG. 9 is an enlarged partial cross-sectional view of a part of a solar cell included in a solar cell panel according to a modified embodiment of the invention. In order to clearly and concisely illustrate a solar cell panel, only a portion corresponding to the enlarged circle in FIG. 5 or FIG. 8 is shown in FIG. 9.

With reference to FIG. 9, in the modified embodiment, a barrier electrode portion 428 is a layer disposed between the first transparent electrode layer 420 and the first metal electrode layer 421. Then, the barrier electrode portion 428 can be formed by a simple method, such as, a sputtering, a spin coating, a spray coating, or so on. After that, the first metal electrode layer 421 may be formed on the barrier electrode portion 428. A width of the barrier electrode portion 428 may be the same as or larger than a width of the first metal electrode layer 421 (more particularly, a width of a pad portion 424 at a portion where the pad portion 424 is positioned). Thereby, the pad portion 424 of the first metal electrode layer 421 where the solder layer 142b is positioned is entirely positioned on the barrier electrode portion 428, and thus, the penetration of the solder layer 142b can be effectively prevented.

The barrier electrode portion 428 may be formed by various methods stated in the descriptions with reference to FIG. 8.

Figure 10:
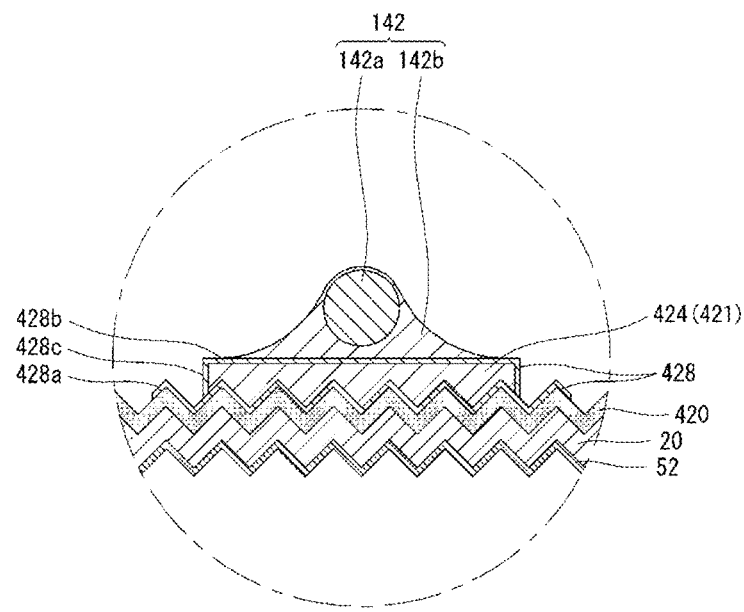
FIG. 10 is an enlarged partial cross-sectional view of a part of a solar cell included in a solar cell panel according to another modified embodiment of the invention.

FIG. 10 is an enlarged partial cross-sectional view of a part of a solar cell included in a solar cell panel according to another modified embodiment of the invention. In order to clearly and concisely illustrate a solar cell panel, only a portion corresponding to the enlarged circle in FIG. 5 or FIG. 8 is shown in FIG. 10.

With reference to FIG. 10, in the modified embodiment, a barrier electrode portion 428 includes a first portion 428a disposed on the first transparent electrode layer 420 and the first metal electrode layer 421 and a second portion 428b disposed on a surface of the first metal electrode layer 421 (an upper surface of the first metal electrode layer 421 in FIG. 10) opposite to the first transparent electrode layer 420. The barrier electrode portion 428 may further include a third portion 428c disposed on side surfaces of the first metal electrode layer 421. The third portion 428c is not necessarily included, and thus, the third portion 428c may be included or not included. Then, the barrier electrode portion 428 for preventing the penetration of the solder layer 142b is formed on both sides of the first metal electrode layer 421, and thus, the penetration of the solder layer 142b can be more effectively prevented.

In this instance, the first portion 428a and the second portion 428b may be separately formed by different steps. Accordingly, a thickness, a material, a composition, a manufacturing method, and so on of the first portion 428a may be different from a thickness, a material, a composition, a manufacturing method, and so on of the second portion 428b, respectively. Thus, the first portion 428a and the second portion 428b may have different properties, and thus, the effect of preventing the penetration of the solder layer 142b can be maximized. However, the embodiments of the invention are not limited thereto, and thus, the first portion 428a and the second portion 428b may have the same thickness, material, and composition, and/or the first portion 428a and the second portion 428b may be formed by the same method. Then, the first portion 428a and the second portion 428b may be formed by the same process condition, and thus, the manufacturing method can be simplified. In this instance, the third portion 428c may be formed by the same process using the same method as the second portion 428b, and thus, a thickness, a material, a composition, a manufacturing method, and so on of the second portion 428c may be the same as a thickness, a material, a composition, a manufacturing method, and so on of the second portion 428b, respectively.

For example, a width of the first portion 428a may be the same as or larger than a width of the first metal electrode layer 421, and the second portion 428b may be disposed on an upper surface and side surfaces of the first metal electrode layer 421 and be in contact with the first portion 428a. Thereby, the first metal electrode layer 421 may be entirely covered by the barrier electrode portion 428.

The barrier electrode portion 428 may be formed by various methods stated in the descriptions with reference to FIG. 8.

In the above descriptions and drawings, it is exemplified that the barrier electrode portion 428 is a layer. The barrier electrode portion 428 formed of a layer can effectively block the penetration path of the solder layer 142b and thus effectively can prevent the penetration of the solder layer 142b. However, the embodiments of the invention are not limited thereto. Other modified embodiments will be described with reference to FIG. 11 to FIG. 13.

Figure 11:
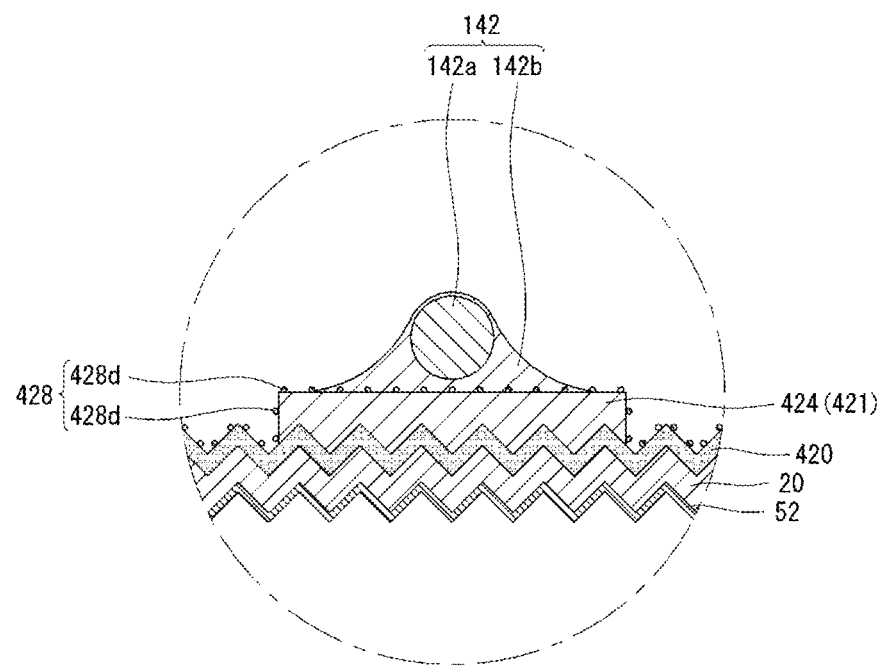
FIG. 11 is an enlarged partial cross-sectional view of a part of a solar cell included in a solar cell panel according to still another modified embodiment of the invention.

FIG. 11 is an enlarged partial cross-sectional view of a part of a solar cell included in a solar cell panel according to still another modified embodiment of the invention. In order to clearly and concisely illustrate a solar cell panel, only a portion corresponding to the enlarged circle in FIG. 5 or FIG. 8 is shown in FIG. 11.

With reference to FIG. 11, in the modified embodiment, a barrier electrode portion 428 may include a plurality of metal particles 428d. At least a part of the metal particles 428d may be adjacent to each other and be in contact with each other, and the other of the metal particles 428d may be spaced from each other. Or, all of the metal particles 428d may be spaced from each other. For example, the barrier electrode portion 428 including the metal particles 428d may be formed by dispersing the metal particles 428d into a small amount of a resin, coating the resin including the metal particles 428d at a desirable position by a spray coating, a spin coating, or soon, and then eliminating the resin (for example, volatilizing the resin by a heat-treatment). However, the embodiments of the invention are not limited thereto. Thus, the barrier electrode portion 428 including the metal particles 428d may be formed by various methods.

A size (or a diameter) of the metal particles 428d may be a micro-meter level or a nano-meter level (for example, 1 nm or more, and 1 mm or less). More particularly, the size of the metal particles 428d may be the nano-meter level (for example, 1 nm or more, and 1 µm or less). Then, a material cost of metal particles 428d may be reduced, and the metal particles 428d may be not visible or may not hinder the light path.

The barrier electrode portion 428 where the metal particles 428d are dispersed may be disposed on an upper surface and side surfaces of the first metal electrode layer 421. In this instance, the metal particles 428d may be formed on a portion where the first metal electrode layer 421 is positioned, and also, may be formed on a portion where the first metal electrode layer 421 is not positioned. Thus, the metal particles 428d may be entirely disposed on the first metal electrode layer 421 and the first transparent electrode layer 420. Since the metal particles 428d have the small size as stated in the above, the metal particles 428d may be not visible or may not hinder the light path even though the metal particles 428d may be disposed on the first transparent electrode layer 420. Then, the barrier electrode portion 428 may be formed by entirely disposing the metal particles 428d without an additional patterning. However, the embodiments of the invention are not limited thereto. Therefore, the metal particles 428d may be locally or partially disposed to correspond to a portion where the first metal electrode layer 421 will be formed, and the metal particles 428d may be disposed or be not disposed on side surfaces of the first metal electrode layer 421.

Figure 12:
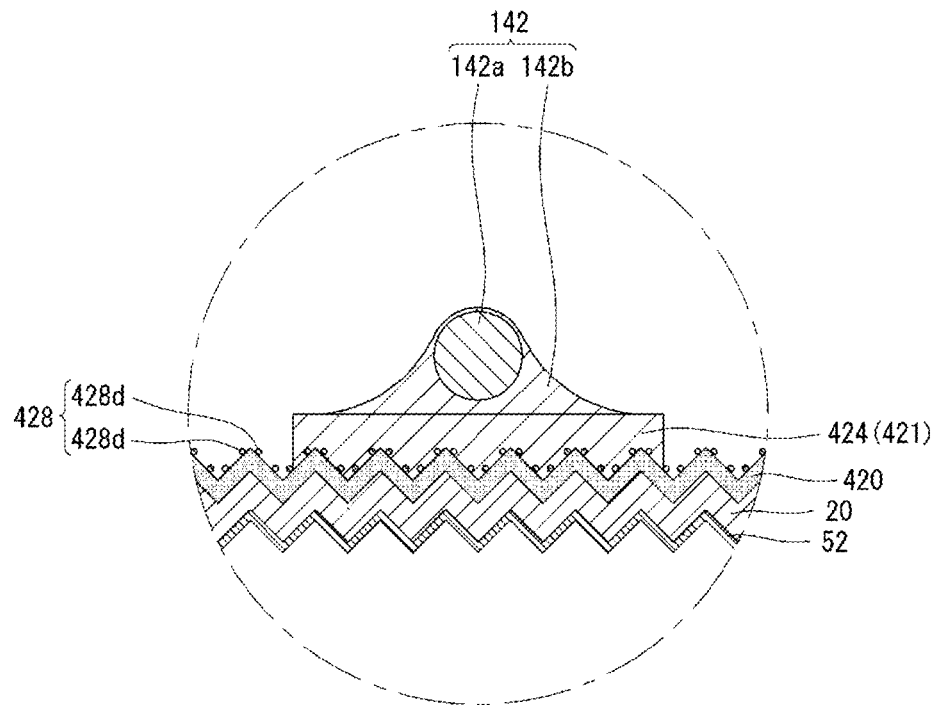
FIG. 12 is an enlarged partial cross-sectional view of a part of a solar cell included in a solar cell panel according to yet another modified embodiment of the invention.

FIG. 12 is an enlarged partial cross-sectional view of a part of a solar cell included in a solar cell panel according to yet another modified embodiment of the invention. In order to clearly and concisely illustrate a solar cell panel, only a portion corresponding to the enlarged circle in FIG. 5 or FIG. 8 is shown in FIG. 12.

With reference to FIG. 12, a barrier electrode portion 428 where a plurality of metal particles 428d are dispersed is disposed between a first metal electrode layer 421 and a first transparent electrode layer 420. In this instance, the metal particles 428d may be formed on a portion where the first metal electrode layer 421 is positioned, and also, may be formed on a portion where the first metal electrode layer 421 is not positioned. Thus, the metal particles 428d may be entirely disposed on the first transparent electrode layer 420. Then, the barrier electrode portion 428 may be formed by entirely disposing the metal particles 428d without an additional patterning. However, the embodiments of the invention are not limited thereto. Therefore, the metal particles 428d may be locally or partially disposed to correspond to a portion where the first metal electrode layer 421 will be formed.

Figure 13:
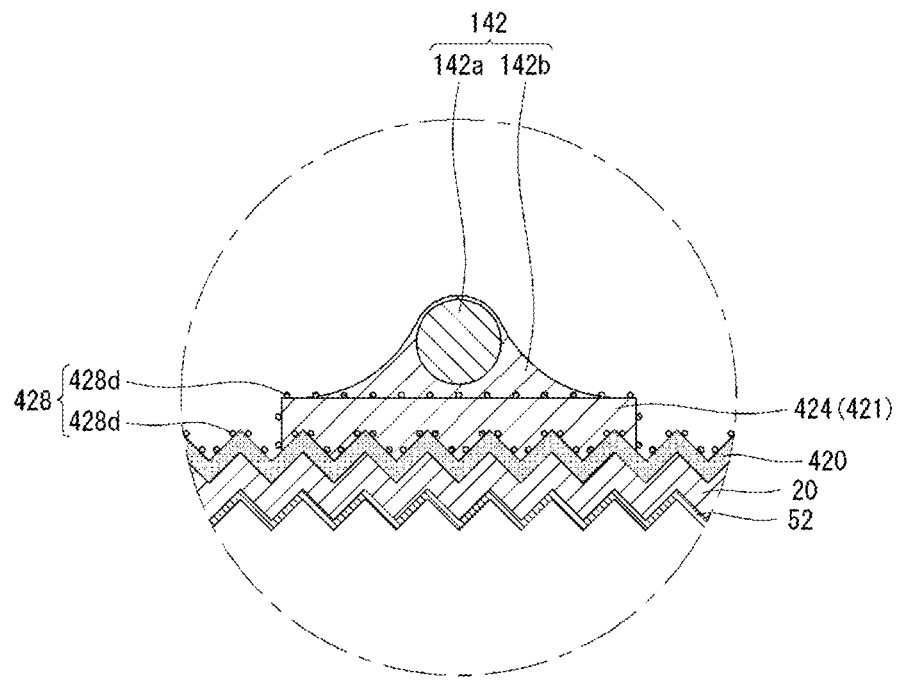
FIG. 13 is an enlarged partial cross-sectional view of a part of a solar cell included in a solar cell panel according to yet still another modified embodiment of the invention.

FIG. 13 is an enlarged partial cross-sectional view of a part of a solar cell included in a solar cell panel according to yet still another modified embodiment of the invention. In order to clearly and concisely illustrate a solar cell panel, only a portion corresponding to the enlarged circle in FIG. 5 or FIG. 8 is shown in FIG. 13.

With reference to FIG. 13, a barrier electrode portion 428 where a plurality of metal particles 428d are dispersed is disposed between a first metal electrode layer 421 and a first transparent electrode layer 420, and on an upper surface and side surfaces of the first metal electrode layer 421. The metal particles 428d disposed between the first metal electrode layer 421 and the first transparent electrode layer 420 and the metal particles 428d disposed on the upper surface (that is, the metal particles 428d disposed between the first metal electrode layer 421 and the lead 142) may have different materials, shapes, diameters, or on, or may be the same materials, shapes, diameters.

In this instance, the metal particles 428d may be formed on a portion where the first metal electrode layer 421 is positioned, and also, may be formed on a portion where the first metal electrode layer 421 is not positioned. Thus, the metal particles 428d may be entirely disposed on the first metal electrode layer 421 and the first transparent electrode layer 420. Then, the barrier electrode portion 428 may be formed by entirely disposing the metal particles 428d without an additional patterning. However, the embodiments of the invention are not limited thereto. Therefore, the metal particles 428d may be locally or partially disposed to correspond to a portion where the first metal electrode layer 421 will be formed, and the metal particles 428d may be disposed or be not disposed on side surfaces of the first metal electrode layer 421.

Also, the embodiments shown in FIG. 8 to FIG. 13 may be combined to each other, and the combinations are also within the scope of the invention. For example, the barrier electrode portion 428 formed of a layer may be disposed between the first metal electrode layer 421 and the first transparent electrode layer 420, and the barrier electrode portion 428 formed of the metal particles 428d may be disposed on the upper surface and/or the side surfaces of the first metal electrode layer 421. Contrary to this, the barrier electrode portion 428 formed of the metal particles 428d may be disposed between the first metal electrode layer 421 and the first transparent electrode layer 420, and the barrier electrode portion 428 formed of a layer may be disposed on the upper surface and/or the side surfaces of the first metal electrode layer 421. Various modifications are possible.

In the embodiment, the barrier electrode portion 428 may be entirely disposed on the first electrode 42 or the second electrode 44. Or, the barrier electrode portion 428 may be selectively disposed to correspond to an entire portion of the bus bar 423 of the first electrode 42 or the second electrode 44. Also, the barrier electrode portion 428 may be selectively disposed to correspond to an entire portion of the finger line of the first electrode 42 or the second electrode 44. Thereby, the effect of the barrier electrode portion 428 can be maximized. However, the embodiments of the invention are not limited thereto. Thus, the barrier electrode portion 428 may be disposed on apart of the first electrode 42 or the second electrode 44 and may be not disposed on the other part of the first electrode 42 or the second electrode 44. Also, a material, a thickness, a shape, and so on of the barrier electrode portion 428 included in the first electrode 42 may be the same as or different from a thickness, a shape, and so on of a barrier electrode portion included in the second electrode 44. Other various modifications are possible.

Hereinafter, the invention will be described in more detail with reference to Experimental examples according to the invention. Following Experimental examples of the inventions are only illustrative for reference, and thus, the embodiments of the invention are not limited thereto.

EXPERIMENTAL EXAMPLE 1

A metal electrode layer was formed by coating a low-temperature paste and heat-treating the same. The low-temperature paste included metal particles, a cross-linking resin, a hardener, and a solvent. The metal particles included spherical-shaped particles having a size of 0.1 to 5 um, and flake-shaped particles having a long width of 2 to 10 um and a thickness of 0.2 to 5 um. In this instance, the spherical-shaped particles were included by 80 parts by weight and the flake-shaped particles were included by 20 parts by weight with respect to 100 parts by weight of the metal particles. The cross-linking resin was an epoxy-based resin, the hardener was an amine-based hardener, and the solvent was butyl carbitol acetate. With respect to 100 parts by weight of a sum of the metal particles and the cross-linking resin, the metal particles were included by 80 parts by weight, the cross-linking resin was included by 20 parts by weight, and the hardener was included 2 parts by weight, the solvent was included by 10 parts by weight.

A lead was attached on the metal electrode layer by a tabbing process of applying heat and pressure to the lead in the state that the lead is disposed on the metal electrode layer. The lead included a core layer including copper and a first solder layer including SnPbAg. After the tabbing process, a pull strength was measured.

EXPERIMENTAL EXAMPLE 2

Pull strength was measured by the method same as the method in Experimental Example 1 except that the lead including a second solder layer of SnBi instead of the first solder layer was attached by the tabbing process.

EXPERIMENTAL EXAMPLE 3

Pull strength was measured by the method same as the method in Experimental Example 1 except that the lead including a third solder layer of SnIn instead of the first solder layer was attached by the tabbing process.

EXPERIMENTAL EXAMPLE 4

Pull strength was measured by the method same as the method in Experimental Example 1 except that the low-temperature paste included metal particles having spherical-shaped particles of 0.1 to 5 um by 100 parts of weights without flake-shaped particles.

EXPERIMENTAL EXAMPLE 5

Pull strength was measured by the method same as the method in Experimental Example 4 except that the lead including the second solder layer of SnBi instead of the first solder layer was attached by the tabbing process.

EXPERIMENTAL EXAMPLE 6

Pull strength was measured by the method same as the method in Experimental Example 4 except that the lead including the third solder layer of SnIn instead of the first solder layer was attached by the tabbing process.

COMPARATIVE EXAMPLE 1

Pull strength was measured by the method same as the method in Experimental Example 1 except that the low-temperature paste included the metal particles having spherical-shaped particles of 10 to 20 um by 100 parts of weights without the flake-shaped particles.

COMPARATIVE EXAMPLE 2

Pull strength was measured by the method same as the method in Comparative Example 1 except that the lead including the second solder layer of SnBi instead of the first solder layer was attached by the tabbing process.

COMPARATIVE EXAMPLE 3

Pull strength was measured by the method same as the method in Comparative Example 1 except that the lead including the third solder layer of SnIn instead of the first solder layer was attached by the tabbing process.

Figure 14:
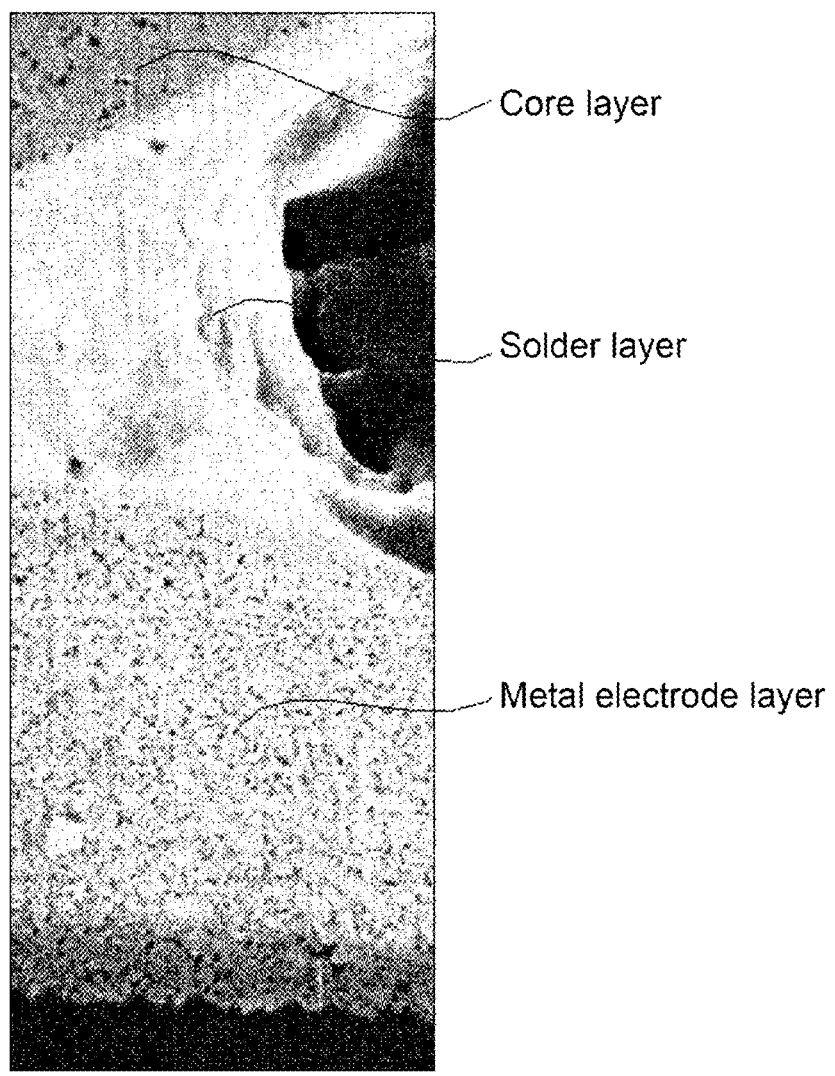
FIG. 14 is a photograph of a cross-section of a metal electrode layer and a lead attached thereto in Experimental Example 1.
Figure 15:
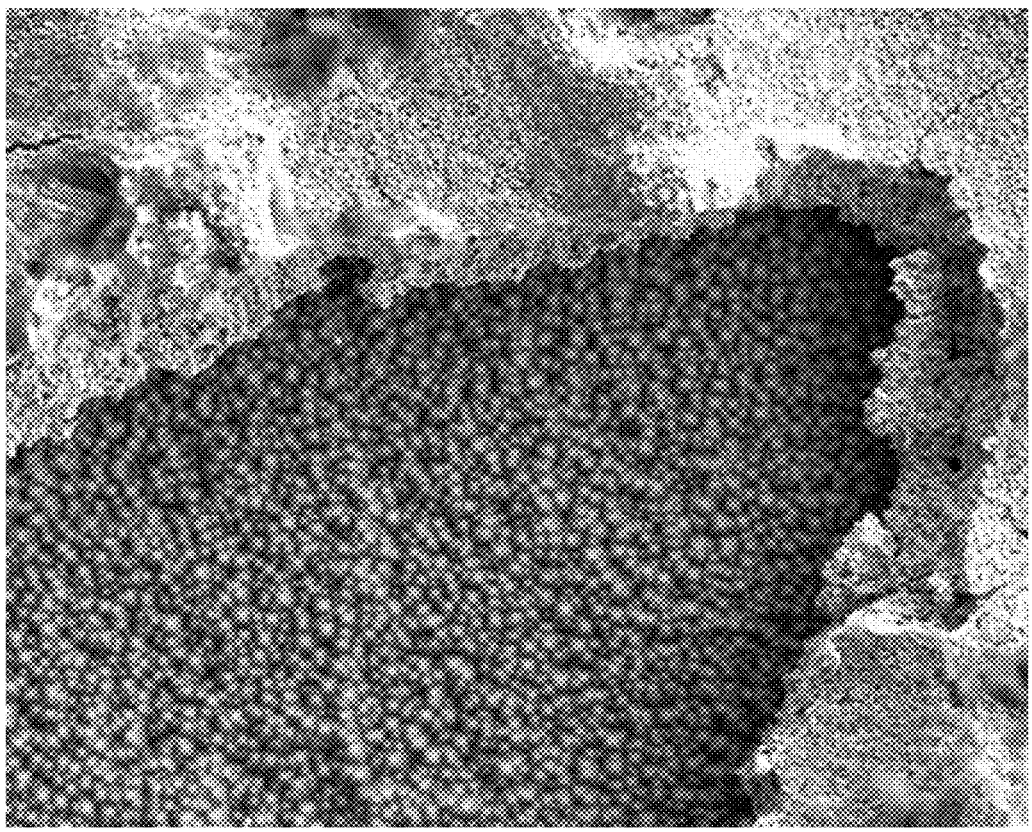
FIG. 15 is a photograph of a state that a tabbing process of a lead was performed but the lead was not attached and was separated from a solar cell in Comparative Example 1.

The pull strengths measured in Experimental Examples 1 to 6, and Comparative Examples 1 to 3 are shown in Table 1 as relative values. Experimental Examples 1 to 6 include particles that are different, while Comparative Examples 1 to 3 include spherical-shaped particles having one size (a large size) only. For reference, in each of Experimental Examples 1 to 6 and Comparative Examples 1 to 3, the pull strengths were measured several times and an average value of the pull strengths is shown in Table 1. Also, a photograph of a cross-section of a metal electrode layer and a lead attached to the same in Experimental Example 1 was taken and is shown in FIG. 14, and a photograph of a state that a tabbing process of a lead was performed but the lead was not attached and was separated from a solar cell in Comparative Example 1 was taken and is shown in FIG. 15.

TABLE 1

|  | Material of Solder layer | Pull Strength |
| --- | --- | --- |
| Experimental Example 1 | SnPbAg | 37 |
| Experimental Example 2 | SnBi | 10 |
| Experimental Example 3 | SnIn | 39 |
| Experimental Example 4 | SnPbAg | 20 |
| Experimental Example 5 | SnBi | 30 |
| Experimental Example 6 | SnIn | 10 |
| Comparative Example 1 | SnPbAg | 0 |
| Comparative Example 2 | SnBi | 0 |
| Comparative Example 3 | SnIn | 0 |

With reference to Table 1, it can be seen that the lead was stably attached on the metal electrode after the tabbing process in Experimental Example 1 to 6. That is, it can be seen that the attachment force was high when the spherical-shaped particles and the flake-shaped particles were used together with reference to Experimental Examples 1 to 3, and it can be seen that the attachment force was high when the spherical-shaped particles of 5 um or less were used with reference to Experimental Examples 4 to 6. Although there is a slight difference according to the materials of the solder layer, it can be seen that the attachment force was high in Experimental Examples 1 to 3 using the spherical-shaped particles and the flake-shaped particles together. Also, with reference to FIG. 14, it can be seen that the solder layer had a portion having a concave shape with respect to the outside at a portion of the solder layer adjacent to the metal electrode layer.

On the other hand, with reference to Table 1 and FIG. 15, it can be seen that the lead was not stably attached to the metal electrode layer after the tabbing process and thus the lead was easily separated from the metal electrode even by a little force in Comparative Examples 1 to 3 using the spherical-shaped particles having a large size only. That is, it can be seen that the attachment property between the lead and the metal electrode layer may be not sufficient in the instance of the metal electrode layer using the spherical-shaped particles having a size of 5 um or more only.

EXPERIMENTAL EXAMPLE 7

Although not included in Table 1, in Experimental Example 7, an electrode was formed and a lead was attached on the electrode by the method same as the method in Experimental Example 1 except that a tabbing process was performed after forming a barrier electrode portion formed of titanium and having a layer shape on an upper surface and side surfaces of a metal electrode layer by plating.

Figure 16:
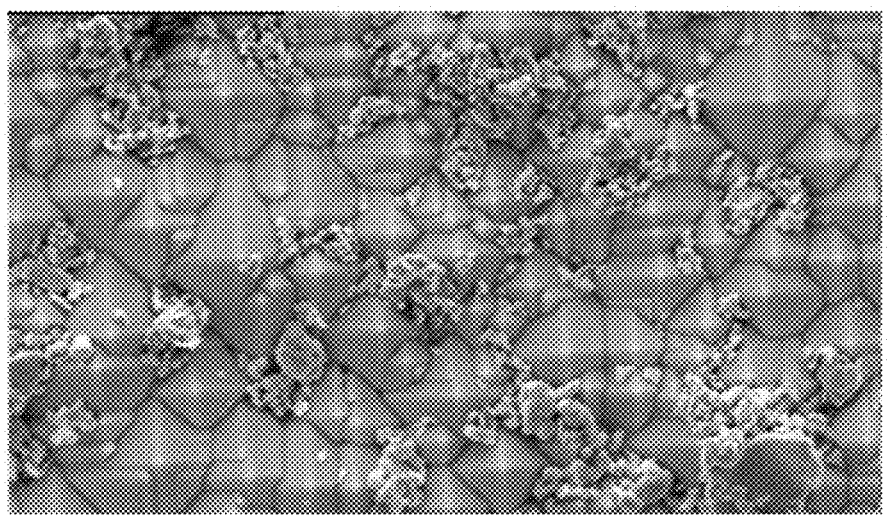
FIG. 16 is a scanning electron microscope (SEM) photograph of a metal electrode layer, after detaching a lead, in Experimental Example 7.
Figure 17:
FIG. 17 is a scanning electron microscope photograph of a metal electrode layer, after detaching a lead, in Comparative Example 1.

A scanning electron microscope (SEM) photograph of a metal electrode layer, after detaching a lead, in Experimental Example 7 is shown in FIG. 16, and a scanning electron microscope photograph of a metal electrode layer, after detaching a lead, in Comparative Example 1 is shown in FIG. 17. With reference to FIG. 16, a material of the solder layer having a needle shape was not found on a texturing structure of a semiconductor substrate, although a residue of silver (Ag) paste was found, in Experimental Example 7. On the other hand, with reference to FIG. 17, it can be seen that there was a lot of a material of the solder layer having a needle shape on a texturing structure of a semiconductor substrate in Comparative Example 1. Accordingly, it can be seen that the barrier electrode portion can effectively prevent the material of the solder layer from penetrating into the metal electrode layer.

The above described features, configurations, effects, and the like are included in at least one of the embodiments of the invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the invention as disclosed in the accompanying claims.

What is claimed is:

1. A solar cell panel comprising:
    a plurality of solar cells comprising at least a first solar cell and a second solar cell; and
    a plurality of leads to connect the first solar cell and the second solar cell,
    wherein each of the first solar cell and the second solar cell comprises:
    a semiconductor substrate;
    a first passivation layer on a front surface of the semiconductor substrate;
    a second passivation layer on a back surface of the semiconductor substrate;
    a first conductivity type region on the first passivation layer at the front surface of the semiconductor substrate;
    a second conductivity type region on the second passivation layer at the back surface of the semiconductor substrate;
    a first electrode electrically connected to the first conductivity type region, the first electrode comprising a first metal electrode layer including a plurality of finger lines in a first direction and a plurality of first bus bars in a second direction crossing the first direction; and
    a second electrode electrically connected to the second conductivity type region, the second electrode comprising a second metal electrode layer including a plurality of second bus bars in the second direction,
    wherein the plurality of leads have a diameter or width of 100 to 500 µm, and comprise 6 or more leads arranged at one surface side of the first or second solar cell,
    wherein each of the plurality of leads comprises a core layer having a circular, oval or round shape and a solder layer coated on the entire outer surface of the core layer,
    wherein the plurality of leads are connected to the plurality of first bus bars of the first solar cell and the plurality of second bus bars of the second solar cell by the solder layer, respectively,
    wherein the solder layer includes a portion adjacent to the first or second electrode, and
    wherein a width of the portion gradually increases toward the first or second electrode.

2. The solar cell panel according to claim 1, wherein the first conductivity type region includes a front surface field region having a conductivity type the same as that of the semiconductor substrate with a higher doping concentration than the semiconductor substrate, and
    wherein the second conductivity type region includes an emitter region having a conductivity type opposite to that of the semiconductor substrate.

3. The solar cell panel according to claim 1, wherein the portion of the solder layer has a concave shape with respect to an outside of the solar cell.

4. The solar cell panel according to claim 1, wherein the plurality of first bus bars or the plurality of second bus bars include a pad portion having a width larger than a width of the solder layer, and
    wherein the solder layer is formed only on a surface of the pad portion opposite to the semiconductor substrate, and is not formed on a side surface of the pad portion.

5. The solar cell panel according to claim 1, wherein at least one of the first and second metal electrode layers includes a metal and a cross-linking resin.

6. The solar cell panel according to claim 5, wherein an amount of the metal is greater than an amount of the cross-linking resin in the first or second metal electrode layer.

7. The solar cell panel according to claim 6, wherein the metal is included by 80 to 95 parts by weight and the cross-linking resin is included by 5 to 20 parts by weight, with respect to 100 parts by weight of a sum of the metal and the cross-linking resin in the first or second metal electrode layer.

8. The solar cell panel according to claim 5, wherein the first or second metal electrode layer does not include a glass frit.

9. The solar cell panel according to claim 5, wherein the cross-linking resin includes at least one of a phenoxy-based resin, an epoxy-based resin, and a cellulose-based resin.

10. The solar cell panel according to claim 5, wherein the metal includes first-shaped particles and second-shaped particles having different shapes from each other.

11. The solar cell panel according to claim 10, wherein the first-shaped particles have a spherical shape and the second-shaped particles have a non-spherical shape, and
    wherein an amount of the first-shaped particles is greater than an amount of the second-shaped particles.

12. The solar cell panel according to claim 10, wherein at least a part of the second-shaped particles has a size greater than a thickness of the solder layer.

13. The solar cell panel according to claim 10, wherein the first-shaped particles have a spherical shape having a diameter of 0.1 to 5 µm, and the second-shaped particles have a flake shape having a long width of 2 to 10 µm and a thickness of 0.2 to 5 µm.

14. The solar cell panel according to claim 5, wherein the metal includes first particles and second particles having different sizes from each other.

15. The solar cell panel according to claim 1, wherein a porosity of the first or second metal electrode layer is higher than a porosity of the solder layer.

16. The solar cell panel according to claim 1, further comprising:
    a barrier electrode portion positioned on the first or second metal electrode layer and having a metal amount greater than a metal amount of the first or second metal electrode layer.

17. The solar cell panel according to claim 16, wherein at least one of the first and second electrodes includes a transparent electrode layer between the first or second conductivity type region and the first or second metal electrode layer,
    wherein the barrier electrode portion is disposed on at least one of a first surface of the first or second metal electrode layer facing the transparent electrode layer, a second surface of the first or second metal electrode layer opposite to the first surface of the first or second metal electrode layer, and a side surface of the first or second metal electrode layer, and wherein the barrier electrode portion has a shape of a layer or particles.

18. The solar cell panel according to claim 1, wherein the semiconductor substrate has a crystalline structure, and wherein at least one of the first and second conductivity type regions has an amorphous structure.

19. The solar cell panel according to claim 18, wherein each of the first and second conductivity type regions includes amorphous silicon, and wherein each of the first and second passivation layers includes an intrinsic amorphous silicon.

20. The solar cell panel according to claim 1, wherein the solder layer includes an inflection point where a curvature varies at a side surface of the solder layer.

* * * * *